United States Patent
Carter et al.

(10) Patent No.: US 7,372,548 B2
(45) Date of Patent: *May 13, 2008

(54) LEVITATED RETICLE-MASKING BLADE STAGE

(75) Inventors: Frederick M. Carter, New Milford, CT (US); Daniel N. Galburt, Wilton, CT (US); Stephen Roux, New Fairfield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/218,620

(22) Filed: Sep. 6, 2005

(65) Prior Publication Data

US 2006/0023195 A1  Feb. 2, 2006

Related U.S. Application Data

(60) Division of application No. 11/128,315, filed on May 13, 2005, which is a continuation of application No. 10/449,663, filed on Jun. 2, 2003, now Pat. No. 6,906,789.

(51) Int. Cl.
*G03B 27/72* (2006.01)
*G03B 27/62* (2006.01)

(52) U.S. Cl. .......................................... 355/71; 355/75

(58) Field of Classification Search .................. 355/71, 355/53, 77, 72, 75; 310/12; 318/135; 396/449, 396/463; 323/264

See application file for complete search history.

(56) References Cited

U.S. PATENT DOCUMENTS

| | | | |
|---|---|---|---|
| 4,952,858 A | 8/1990 | Galburt | 318/647 |
| 5,486,896 A | 1/1996 | Hazama et al. | 355/71 |
| 5,663,783 A | 9/1997 | Ueda | 355/53 |
| 5,747,780 A | 5/1998 | Shioyama et al. | 219/648 |
| 5,900,707 A | 5/1999 | Wakui | 318/625 |

(Continued)

FOREIGN PATENT DOCUMENTS

JP  11-026379  1/1999

(Continued)

OTHER PUBLICATIONS

U.S. Appl. No. 10/366,444, filed Feb. 14, 2003, Carter et al.

(Continued)

*Primary Examiner*—Peter B. Kim
(74) *Attorney, Agent, or Firm*—Sterne, Kessler, Goldstein & Fox P.L.L.C.

(57) ABSTRACT

A method, apparatus, and system for controlling a reticle-masking blade in a photolithography system. A reticle-masking blade is supported with a reticle-masking blade carriage assembly. The reticle-masking blade carriage assembly is levitated at a position with respect to a reference frame and at an orientation with respect to the reference frame. Preferably, the reticle-masking blade carriage assembly is electromagnetically levitated. At least one of the position and the orientation of the reticle-masking blade carriage assembly is measured. At least one of the position and the orientation of the reticle-masking blade carriage assembly is controlled. Optionally, the reticle-masking blade carriage assembly is moved within a dimension within a range defined by the reference frame. The dimension can be two dimensions. The movement of the reticle-masking blade carriage assembly can be controlled.

19 Claims, 18 Drawing Sheets

U.S. PATENT DOCUMENTS

| | | | | |
|---|---|---|---|---|
| 6,040,893 | A | 3/2000 | Ebinuma | 355/53 |
| 6,069,418 | A | 5/2000 | Tanaka | 310/12 |
| 6,259,509 | B1* | 7/2001 | Miwa et al. | 355/53 |
| 6,262,797 | B1 | 7/2001 | Horikawa | 355/53 |
| 6,271,606 | B1 | 8/2001 | Hazelton | 310/12 |
| 6,307,619 | B1 | 10/2001 | Galburt et al. | 355/53 |
| 6,359,678 | B1 | 3/2002 | Ota | 355/53 |
| 6,429,561 | B1 | 8/2002 | Davis et al. | 310/90.5 |
| 6,437,463 | B1 | 8/2002 | Hazelton et al. | 310/12 |
| 6,509,957 | B1 | 1/2003 | Tanaka | 355/72 |
| 6,597,002 | B1 | 7/2003 | Kondo | 250/492.2 |
| 6,781,669 | B2 | 8/2004 | Tanaka | 355/53 |
| 2001/0055733 | A1* | 12/2001 | Irie et al. | 430/396 |
| 2002/0011759 | A1 | 1/2002 | Adams et al. | 310/309 |
| 2004/0043198 | A1 | 3/2004 | Froebel et al. | 428/195.1 |
| 2004/0160132 | A1 | 8/2004 | Carter et al. | 310/12 |
| 2004/0160203 | A1 | 8/2004 | Carter et al. | 318/114 |

FOREIGN PATENT DOCUMENTS

| | | |
|---|---|---|
| JP | 11-233399 A | 8/1999 |
| WO | WO99/63585 | 12/1999 |

OTHER PUBLICATIONS

U.S. Appl. No. 10/449,001, filed Jun. 2, 2003, Galburt et al.

"Lithography," *International Roadmap for Semiconductors*, 2001 Edition, pp. 1-17.

*Semiconductor Manufacturing Process*, <1 page (visited Feb. 27, 2002).

*Overview of Align/Expose/Develop Steps*, 1 page, from http://www.ee.washington.edu/research/microtech/cam/PROCESSES/Photolithography/ph..., (visited Aug. 25, 2002).

*Photoresist Spin Coating*, 1 page from http://www.ee.washington.edu/research/microtech/cam/PROCESSES/Photolithography/ph..., (visited Aug. 25, 2002).

*Photolithography*, 1 page, from http://www.ee.washington.edu/research/microtech/cam/PROCESSES/Photolithography/ph..., (visited Aug. 25, 2002).

*How Chips are Made*, 4 pages, from http://www.elume.com/howchips.html,(visited Aug. 25, 2002).

*Extreme Ultraviolet Lithography: Imaging the Future*, 12 pages, from http://www.llnl.gov/str/Sween.html, (visited Aug. 27, 2002).

*EUV Lithography (EUVL)*, 2 pages, from http://student.science.nus.edu.sg/~sci70806/euv.html, (visited Aug. 27, 2002).

*EUV Engineering Test Stand*, 2 pages.

Powell, F.R. and Johnson, T.A., "Filter windows for EUV lithography," 3 pages.

Mercer, I.P. et al., "EUV light source and laser considerations for scalability and high-energy conversion efficiency," *SPIE's International Symposium: High-Power Laser Ablation 2002*, Paper No. 4760-76, 11 pages, (Apr. 21-26, 2002).

*Keeping the "More" in Moore's Law*, 4 pages, from http://www.llnl.gov/str/Sweeney.html, (visited Aug. 27, 2002).

Gwyn, C., "EUV lithography: The timeline puts the screws to extreme ultraviolet lithography, but engineers rise to the challenge," 6 pages, from http://oemagazine.com/fromTheMagazine/jun02/euv.html, (Jun. 2002).

English machine translation of JP11-233399 A, as available at the website of Japanese Patent Office, Aug. 1999.

English machine translation of JP11-026379, as available at the website of Japanese Patent Office, Jan. 1999.

* cited by examiner

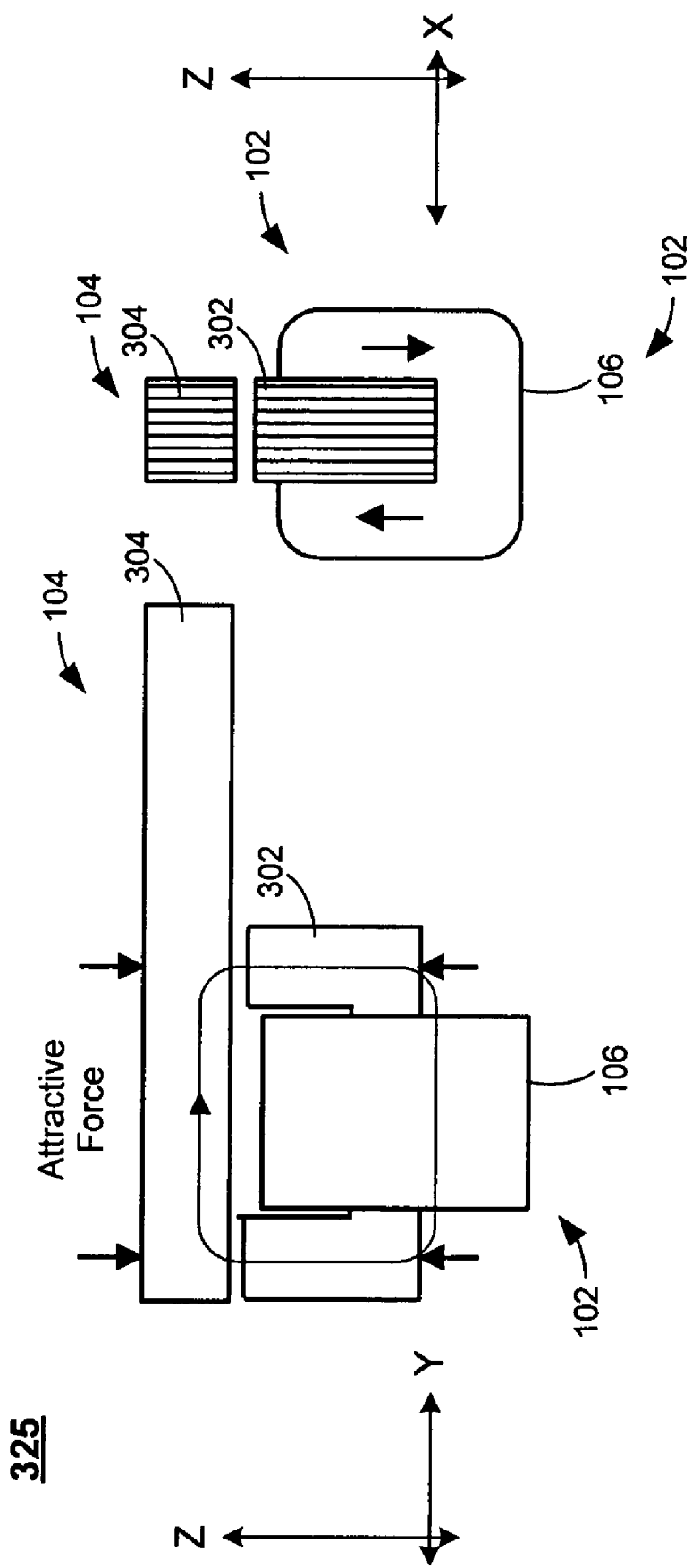

LEVITATED RETICLE-MASKING BLADE STAGE

CROSS-REFERENCE TO RELATED APPLICATIONS

This application is a division of U.S. application Ser. No. 11/128,315, filed May 13, 2005, which is a continuation of U.S. application Ser. No. 10/449,663, filed Jun. 6, 2003, now U.S. Pat. No. 6,906,789, each of which is incorporated herein in its entirety by reference.

This patent application is related to the following commonly owned, U.S. utility patent application: "System, Method, and Apparatus for a Magnetically Levitated and Driven Reticle-Masking Blade Stage Mechanism" Ser. No. 10/449,001, by D. Galburt et al., filed Jun. 6, 2003, now U.S. Pat. No. 6,950,175, and incorporated herein by reference.

BACKGROUND OF THE INVENTION

1. Field of the Invention

The present invention relates to lithography. More specifically, the present invention relates to a magnetically levitated and driven reticle-masking blade stage mechanism.

2. Related Art

The size of circuit elements that can be used in integrated circuits is a direct function of the wavelength of light used in the projection photolithography fabrication process. Thus, realization of integrated circuits with increasingly smaller features depends on the development of photolithography tools that operate with progressively smaller wavelengths.

State-of-the-art projection photolithography tools now utilize deep ultraviolet (DUV) light with wavelengths of 248 nm, 193 nm, or 157 nm. At these wavelengths available optical materials, including silicon oxide and calcium fluoride, allow the use of both transmission reticles, and refractive optical elements. Since the shorter wavelengths are absorbed by oxygen, nitrogen or helium must be used in the optical path.

Future photolithography tools may utilize extreme ultraviolet (EUV) radiation with wavelengths of 10 nm to 15 nm. At these wavelengths the reticle and all other optical elements must be reflective, and the entire optical path must be evacuated.

In a state-of-the-art projection lithography tool, the exposing light from the source optics is transmitted through, or reflected from, the patterned reticle and then imaged by projection optics onto the surface of a resist coated wafer. High-resolution projection optics have relatively small field sizes and thus require that the wafer and the reticle be scanned synchronously to expose a full rectangular field. The reticle has an absorbing layer, usually chrome, in the border area that surrounds the circuit pattern to prevent unwanted exposure of the wafer. Additionally, a state-of-the-art projection lithography tool usually has movable reticle-masking (REMA) blades that: (1) remove the need for having a wide (i.e., expensive) border area, (2) block light that might otherwise leak through pin holes in the border area, (3) allow a selected portion of the full patterned area to be exposed, and (4) selectively block reticle alignment targets so that they are not printed on the wafer.

Generally, lithography tools use four independently movable REMA blades configured as two pairs. One pair of REMA blades has edges that are aligned parallel to the exposure scan axis. This first pair remains stationary during the exposure scan and delimits the width of the exposed field. A second pair of REMA blades has edges that are aligned orthogonal to the scan axis. This second pair moves synchronously with the reticle and delimits the length of the exposed field. Synchronous scanning can be achieved by attaching the second pair of REMA blades to the reticle stage and prepositioning them prior to the exposure scan. Unfortunately, because the second pair of REMA blades requires frequent adjustments, this approach can limit the overall throughput of the lithography tool.

For state-of-the-art DUV lithography tools, a preferred design approach is to locate the REMA blades at an image plane conjugate to the reticle rather than near the reticle itself. Locating the REMA blades near the reticle results in significant blurring of the delimiting edges imaged on the wafer. By locating the REMA blades at an image plane conjugate, the edges of the REMA blades can be sharply imaged on the wafer. Because there is usually no suitable image plane conjugate near the projection optics, the image plane conjugate typically is produced by optics in the illuminator.

REMA blades typically are moved by linear stage mechanisms that are driven by linear motors and that are guided by ball bearings, roller bearings, or gas bearings. The stages that control the motion of the scanning REMA blades must have capabilities that match those of the reticle stage. The stages that control the motion of the scanning REMA blades must be characterized by a high rate of acceleration and a long life. A preferred REMA blade motion control mechanism for use in DUV tools is described in U.S. Pat. No. 6,307,619 to Galburt et al., entitled "Scanning Framing Blade Apparatus", issued Oct. 23, 2001, which is incorporated herein by reference.

Experimental work with EUV lithography tools suggests that a preferred location for the REMA blades be in front of the reflective reticle rather than at an image plane conjugate. In contrast with DUV systems, in EUV systems the additional optics necessary to produce an image plane conjugate results in excessive attenuation of the exposing beam. Fortunately, EUV systems are also characterized by relatively low numerical aperture projection optics and the absence of a protective pellicle. These features minimize the blurring of the delimiting edges imaged on the wafer that can occur when the REMA blades are located near the reticle.

However, in EUV systems the REMA blades must operate in a high vacuum environment. This gives rise to problems in using gas bearings or conventional anti-friction bearings in the stage mechanisms. Specifically, gas bearings would have to be isolated from the high vacuum environment. Likewise, ball or roller anti-friction bearings would have to be operated without lubrication, which would reduce the life of these bearings and would allow particles to be generated that could contaminate the surface of the unprotected reticle or other optical devices. Therefore, what is needed is a REMA blade stage mechanism that can support guided motion of REMA blades in a high vacuum environment. Preferably, such a REMA blade stage mechanism would also be able to support more than one degree of freedom of motion.

SUMMARY OF THE INVENTION

The present invention relates to a magnetically levitated and driven reticle-masking (REMA) blade stage mechanism. In one preferred embodiment, the present invention comprises a REMA blade system including a REMA blade, a REMA blade carriage assembly, a set of electromagnetic force actuators, an electromagnetic linear force motor, a set of sensors, and a servomechanism controller. The REMA blade has a substantially linear masking edge. The REMA blade is coupled to the REMA blade carriage assembly.

The set of electromagnetic force actuators is capable of levitating the REMA blade carriage assembly at a position with respect to a reference frame and at an orientation with respect to the reference frame. The position is within a range of positions. Each electromagnetic force actuator has a first component coupled to the REMA blade carriage assembly and a second component coupled to a reaction frame. At least one of the first component and the second component has a first coil that is capable of receiving a second signal from the servomechanism controller.

The electromagnetic linear force motor is capable of imparting a motion to the REMA blade carriage assembly with respect to the reference frame. The electromagnetic force linear motor has a third component coupled to the REMA blade carriage assembly and a fourth component coupled to the reaction frame. The reference frame defines a range of the motion. At least one of the third component and the fourth component has a second coil that is capable of receiving a third signal from the servomechanism controller.

The set of sensors is capable of measuring the position and the orientation of the REMA blade carriage assembly with respect to the reference frame. Each sensor has a fifth component coupled to the REMA blade carriage assembly and a sixth component coupled to the reference frame. Interaction between the fifth and the sixth components is via an energy field rather than physical contact. At least one of the fifth component and the sixth component is capable of generating a first signal sent to the servomechanism controller.

The servomechanism controller is capable of controlling the position and the orientation of the REMA blade carriage assembly with six degrees of freedom of motion. The servomechanism controller is further capable of controlling the motion of the REMA blade carriage assembly within the range.

In another preferred embodiment, the present invention comprises a REMA blade system including a REMA blade, a REMA blade carriage assembly, a set of electromagnetic force actuators, a planar Lorentz force motor, a set of sensors, and a servomechanism controller. The REMA blade has a first substantially linear masking edge and a second substantially linear masking edge. The first and the second substantially linear masking edges form a substantially right angle. The REMA blade is coupled to the REMA blade carriage assembly.

The set of electromagnetic force actuators is capable of levitating the REMA blade carriage assembly at a position with respect to a reference frame and at an orientation with respect to the reference frame. The position is within a range of positions. Each electromagnetic force actuator has a first component coupled to the REMA blade carriage assembly and a second component coupled to a reaction frame. At least one of the first component and the second component has a first coil that is capable of receiving a second signal from the servomechanism controller.

The planar Lorentz force motor is capable of imparting a motion to the REMA blade carriage assembly with respect to the reference frame. The planar Lorentz force motor has a third component coupled to the REMA blade carriage assembly and a fourth component coupled to the reaction frame. The reference frame defines a two-dimensional range of the motion. At least one of the third component and the fourth component has a second coil that is capable of receiving a third signal from the servomechanism controller.

The set of sensors is capable of measuring the position and the orientation of the REMA blade carriage assembly with respect to the reference frame. Each sensor has a fifth component coupled to the REMA blade carriage assembly and a sixth component coupled to the reference frame. Interaction between the fifth and the sixth components is via an energy field rather than physical contact. At least one of the fifth component and the sixth component is capable of generating a first signal sent to the servomechanism controller.

The servomechanism controller is capable of controlling the position and the orientation of the REMA blade carriage assembly with six degrees of freedom of motion. The servomechanism controller is further capable of controlling the motion of the REMA blade carriage assembly within the two-dimensional range.

In a more general embodiment, the present invention comprises a REMA blade system including a REMA blade carriage assembly, an electromagnetic force actuator, a sensor, and a controller. The REMA blade carriage assembly is capable of supporting a REMA blade. The electromagnetic force actuator is capable of levitating the REMA blade carriage assembly at a position with respect to a reference frame and at an orientation with respect to the reference frame. The electromagnetic force actuator has a first component coupled to the REMA blade carriage assembly and a second component coupled to a reaction frame. The position is within a range of positions. At least one of the first component and the second component has a first coil that is capable of receiving a second signal from the controller. The sensor is capable of measuring at least one of the position and the orientation of the REMA blade carriage assembly with respect to the reference frame. The sensor has a third component coupled to the REMA blade carriage assembly and a fourth component coupled to the reference frame. At least one of the third component and the fourth component is capable of generating a first signal sent to the controller. Preferably, interaction between the third and the fourth components is via an energy field rather than physical contact. The controller is capable of controlling at least one the position and the orientation of the REMA blade carriage assembly. Preferably, the controller is a servomechanism controller.

The electromagnetic force actuator can be a Lorentz force actuator, a reluctance force actuator, etc. Preferably, the electromagnetic force actuator is a set of electromagnetic force actuators. Optionally, the electromagnetic force actuator can further comprises a fifth component coupled to the REMA blade carriage assembly and a sixth component coupled to the reaction frame. The fifth and the sixth components can have permanent magnets.

The sensor can be a position sensor, an angle sensor, etc. Preferably, the sensor is a set of sensors. Preferably, the controller is capable of controlling the position and the orientation of to the REMA blade carriage assembly with six degrees of freedom of motion.

Optionally, the REMA blade system can include a REMA blade, which is coupled to the REMA blade carriage assembly. The REMA blade can have a first masking edge. The first masking edge can be substantially linear. The REMA blade can have a second masking edge. The first and the second masking edges can form an angle. The angle can be substantially a right angle.

Optionally, the REMA blade system can include an electromagnetic force motor. The electromagnetic force motor is capable of imparting a motion to the REMA blade carriage assembly within a dimension with respect to the reference frame. The electromagnetic force motor has a fifth component coupled to the REMA blade carriage assembly and a sixth component coupled to the reaction frame. The reference frame defines a range of the motion within the dimension. The sensor can be a position sensor. The controller can be capable of controlling the motion. Preferably, at least one of the fifth component and the sixth component has a second coil that is capable of receiving a third signal from the controller.

The second coil that is capable of receiving a third signal can be the first coil that is capable of receiving the second signal. The fifth component coupled to the REMA blade carriage assembly can be the first component coupled to the REMA blade carriage assembly. The sixth component coupled to the reaction frame can be the second component coupled to the reaction frame. The electromagnetic force motor can be a Lorentz force motor. The with respect to the reference frame can be two dimensions. The Lorentz force motor can be a planar Lorentz force motor.

The reference frame can be a stationary portion of a photolithography system. The reference frame can be a component of a reticle stage system. The component can be a balance mass. The reference frame can be the reaction frame. The reaction frame can be a balance mass.

Optionally, the REMA blade system can include a second REMA blade carriage assembly, a second electromagnetic force actuator, a second sensor, and a second controller. The second REMA blade carriage assembly is capable of supporting a second REMA blade. The second electromagnetic force actuator is capable of levitating the second REMA blade carriage assembly at a second position with respect to a second reference frame and at a second orientation with respect to the second reference frame. The second reference frame can be the reference frame. The second electromagnetic force actuator has a fifth component coupled to the second REMA blade carriage assembly and a sixth component coupled to a second reaction frame. The sixth component coupled to a second reaction frame can be the second component coupled to the reaction frame. The second position is within a second range of positions. At least one of the fifth component and the sixth component has a second coil that is capable of receiving a fourth signal from the second controller. The second sensor is capable of measuring at least one of the second position and the second orientation of the second REMA blade carriage assembly with respect to the second reference frame. The second sensor has a seventh component coupled to the second REMA blade carriage assembly and an eighth component coupled to the second reference frame. At least one of the seventh component and the eighth component is capable of generating a third signal sent to the second controller. The second controller is capable of controlling at least one of the second position and the second orientation of the second REMA blade carriage assembly. The second controller can be the controller.

Furthermore, the REMA blade system can optionally include a second REMA blade, which is coupled to the second REMA blade carriage assembly. The REMA blade can have a first masking edge and the second REMA blade can have a second masking edge. The first and the second masking edges can be substantially linear. The first and the second masking edges can be substantially parallel.

Alternatively, the REMA blade can have a third masking edge and the second REMA blade can have a fourth masking edge. The first and the third masking edges can form a first angle and the second and the fourth masking edges can form a second angle. The first angle can substantially equal the second angle. The first and the second angles can be substantially right angles. The REMA blade can have an "L" shape, a "T" shape, a first "staircase" shape, etc. The second REMA blade can have an "L" shape, a "T" shape, a second "staircase" shape, etc.

The second reference frame can be the reference frame. The position can be a first distance from the reference frame and the second position can be a second distance from the reference frame. In one alternative, the first distance can be substantially equal to the second distance. The REMA blade can be configured to levitate at a third position and the second REMA blade can be configured to levitate at a fourth position, where the third position is different from the fourth position. In another alternative, the first distance can be different from the second distance. The second orientation can be substantially the same as the orientation. The eighth component coupled to the second reference frame can be the fourth component coupled to the reference frame.

Furthermore, the REMA blade system can optionally include a first electromagnetic force motor and a second electromagnetic force motor. The first electromagnetic force motor is capable of imparting a first motion to the REMA blade carriage assembly within a first dimension with respect to the reference frame. The first electromagnetic force motor has a ninth component coupled to the REMA blade carriage assembly and a tenth component coupled to the reaction frame. The reference frame defines a first range of the first motion within the first dimension. The second electromagnetic force motor is capable of imparting a second motion to the second REMA blade carriage assembly within a second dimension with respect to the second reference frame. The second electromagnetic force motor has an eleventh component coupled to the second REMA blade carriage assembly and a twelfth component coupled to the second reaction frame. The second reference frame defines a second range of the second motion within the second dimension.

The controller can be capable of controlling the first motion and the second controller can be capable of controlling the second motion. The second reference frame can be the reference frame. The second dimension can be the first dimension. The second range can be the first range. The second reaction frame can be the reaction frame. The twelfth component coupled to the second reaction frame can be the tenth component coupled to the reaction frame.

The present invention also comprises a method of controlling a REMA blade in a photolithography system. In the method, a REMA blade is supported with a REMA blade carriage assembly. The REMA blade carriage assembly is levitated at a position with respect to a reference frame and at an orientation with respect to the reference frame. Preferably, the REMA blade carriage assembly is electromagnetically levitated, but the present invention is not limited to this mode of levitation. The present invention can also be realized, for example, by electrostatic levitation. At least one of the position and the orientation of the REMA blade carriage assembly is measured. At least one of the position and the orientation of the REMA blade carriage assembly is controlled.

Preferably, the position and the orientation of the REMA blade carriage assembly is controlled with six degrees of freedom of motion. The position and the orientation of the REMA blade carriage assembly can be controlled by: (1) sending a first signal, that corresponds to a measure of at least one of the position and the orientation of the REMA blade carriage assembly, to a first component, that performs the controlling and (2) receiving, from the first component, a second signal at a second component that causes the levitating.

Optionally, the REMA blade carriage assembly is moved within a dimension within a range defined by the reference frame. The dimension can be two dimensions. The movement of the REMA blade carriage assembly can be controlled. The movement of the REMA blade carriage assembly can be controlled by: (1) sending a first signal, that corresponds to a measure of at least one of the position and the orientation of the REMA blade carriage assembly, to a first component, that performs the controlling and (2) receiving, from the first component, a second signal at a second component that causes the moving.

The present invention also comprises an apparatus for levitating a REMA blade including a REMA blade carriage assembly and a first electromagnetic component. The REMA blade carriage assembly is capable of supporting the REMA blade. The first electromagnetic component is coupled to the REMA blade carriage assembly and is configured to interact with a second electromagnetic component coupled to a reaction frame to levitate the REMA blade carriage assembly at a position with respect to a reference frame and at an orientation with respect to the reference frame. The position is within a range of positions. Optionally, the apparatus can include a REMA blade that is coupled to the REMA blade carriage assembly.

Usually, the reaction frame is magnetically coupled to the REMA blade carriage assembly. The first and the second electromagnetic components can interact to produce a Lorentz force directed from the second electromagnetic component to the first electromagnetic component. The second electromagnetic component can comprise a back iron coupled to a permanent magnet, a Halbach magnet coupled to a permanent magnet, a checkerboard array of permanent magnets, etc. The checkerboard array of permanent magnets can include Halbach magnets coupled to the permanent magnets.

The reaction frame can comprise a first reaction frame portion and a second reaction frame portion. The REMA blade carriage assembly can be positioned between the first and the second reaction frame portions. The first and the second electromagnetic components can interact to produce a Lorentz force that is directed substantially perpendicular to a direction from the first reaction frame portion to the second reaction frame portion.

Alternatively, the REMA blade carriage assembly can comprise a first REMA blade carriage assembly portion and a second REMA blade carriage assembly portion. The reaction frame can be positioned between the first and the second REMA blade carriage assembly portions. The first and the second electromagnetic components can interact to produce a Lorentz force that is directed substantially perpendicular to a direction from the first REMA blade carriage assembly portion to the second REMA blade carriage assembly portion.

The first and the second electromagnetic components can interact to produce a reluctance force. The second magnetic component can comprise a coil that is wrapped around a portion of a core. The coil is capable of conveying an electric current. The core can have an "E" shape, a "C" shape, etc.

The apparatus can further comprise a third magnetic component coupled to the REMA blade carriage assembly and a fourth magnetic component coupled to the reaction frame. The third and the fourth magnetic components can have permanent magnets.

The apparatus can further comprise a third electromagnetic component coupled to the REMA blade carriage assembly and configured to interact with a fourth electromagnetic component coupled to the reaction frame to impart a motion to the REMA blade carriage assembly within a dimension with respect to the reference frame. The reference frame defines a range of the motion within the dimension. The third electromagnetic component can be the first electromagnetic component. The fourth electromagnetic component can be the second electromagnetic component. The dimension can be two dimensions.

The third and the fourth electromagnetic components can interact to produce a Lorentz force directed substantially perpendicular to a direction from the fourth electromagnetic component to the third electromagnetic component. At least one of the third and the fourth electromagnetic components can have drive coils. The drive coils are capable of conveying electric currents. A first drive coil can be capable of conveying a first electric and a second drive coil can be capable of conveying a second electric current. The electric currents can be capable of varying with time such that the first electric current is configured to be out of phase with the second electric current.

The fourth electromagnetic component can comprise a back iron coupled to a permanent magnet, a Halbach magnet coupled to a permanent magnet, a checkerboard array of permanent magnets, etc. The checkerboard array of permanent magnets can include Halbach magnets coupled to the permanent magnets.

The reaction frame can comprise a first reaction frame portion and a second reaction frame portion. The REMA blade carriage assembly can be positioned between the first and the second reaction frame portions. Alternatively, the REMA blade carriage assembly can comprise a first REMA blade carriage assembly portion and a second REMA blade carriage assembly portion. The reaction frame can be positioned between the first and the second REMA blade carriage assembly portions.

Further embodiments, features, and advantages of the present invention, as well as the structure and operation of the various embodiments of the present invention, are described in detail below with reference to the accompanying figures.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 3A and 3B show two views for each of two exemplary reluctance force actuators 300 and 325.

Figure 10:
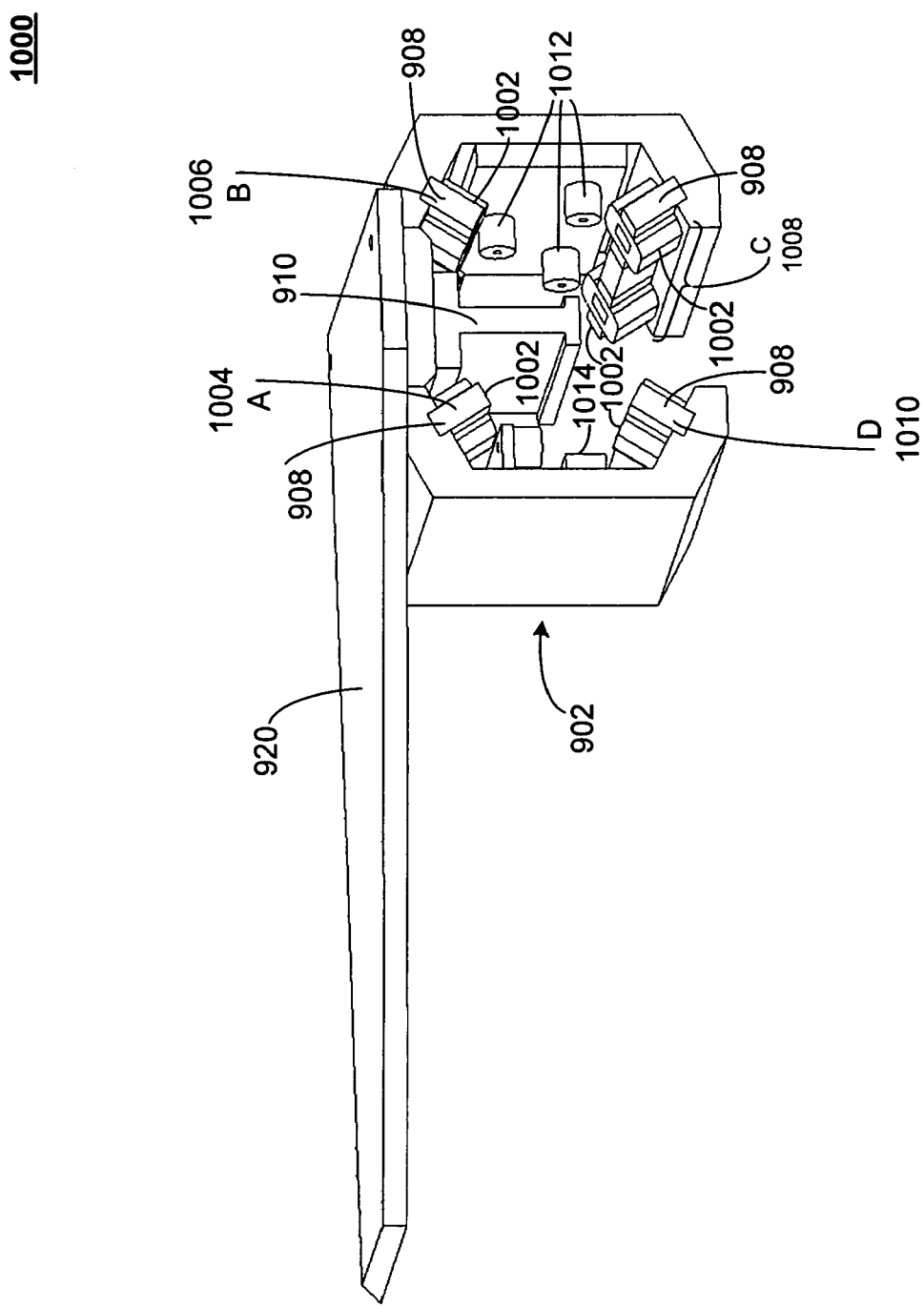

FIG. 10 shows first object 902 (levitated object) with first REMA blade 914 of linear REMA blade stage mechanism 900.

Figure 11:
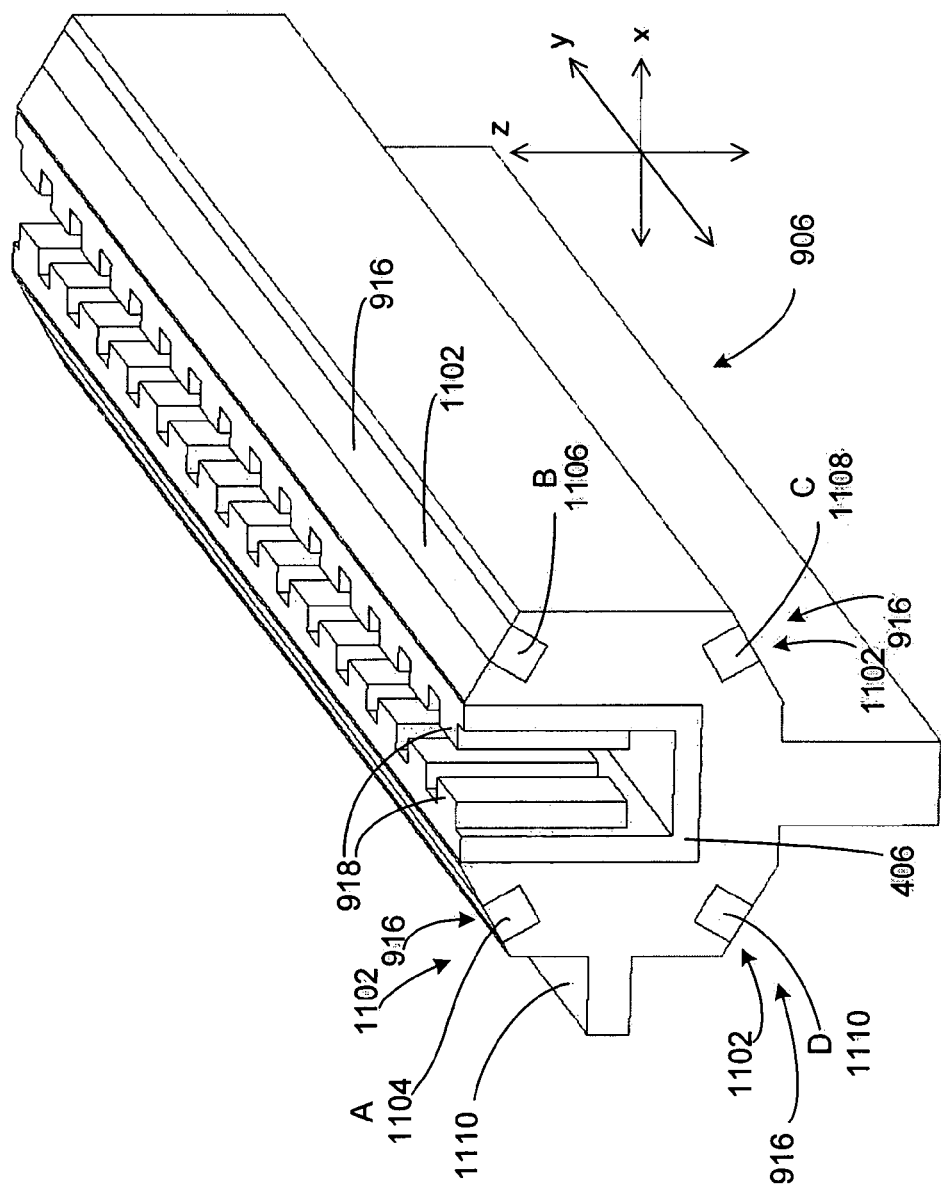

FIG. 11 shows third object 906 (reaction frame) of linear REMA blade stage mechanism 900.

Figure 12:
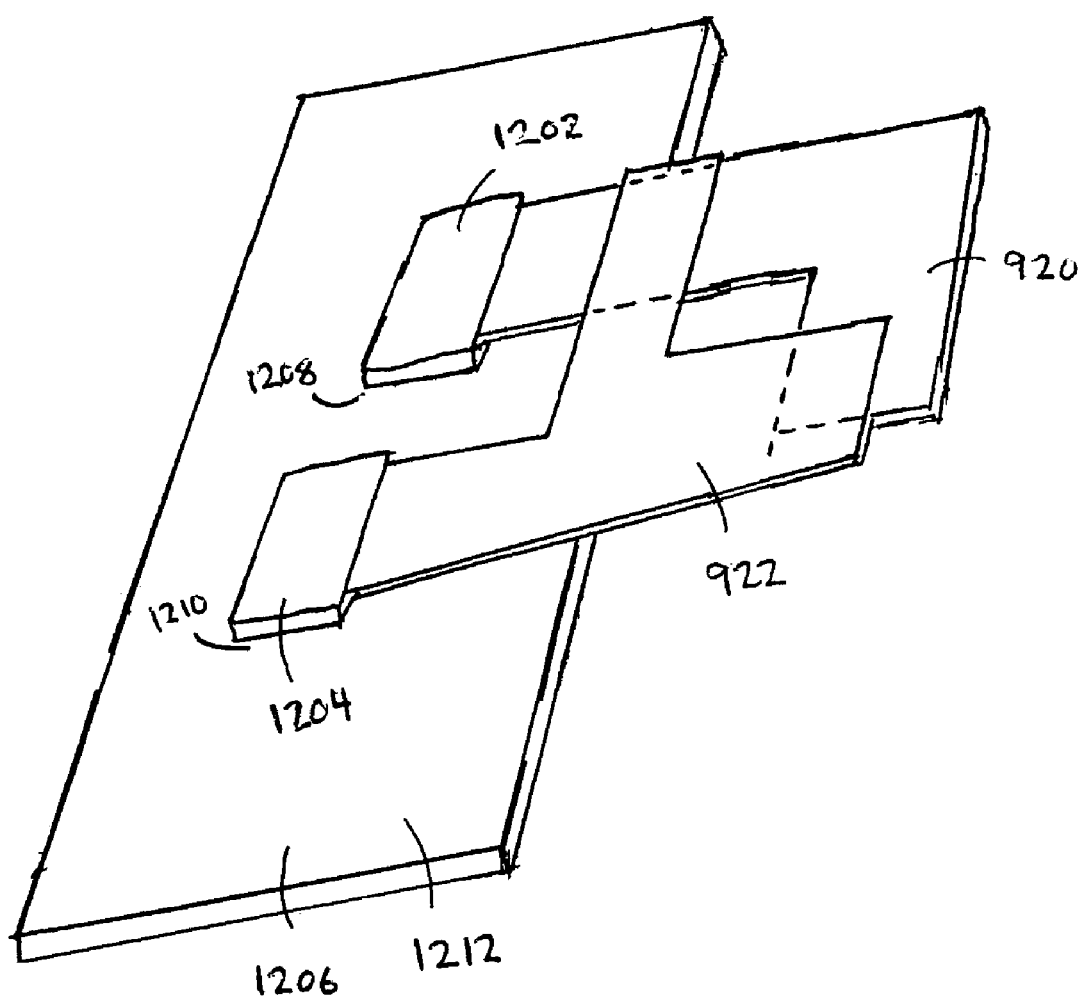

FIG. 12 shows a planar REMA blade stage mechanism 1200 in the manner of the present invention.

Figure 13:
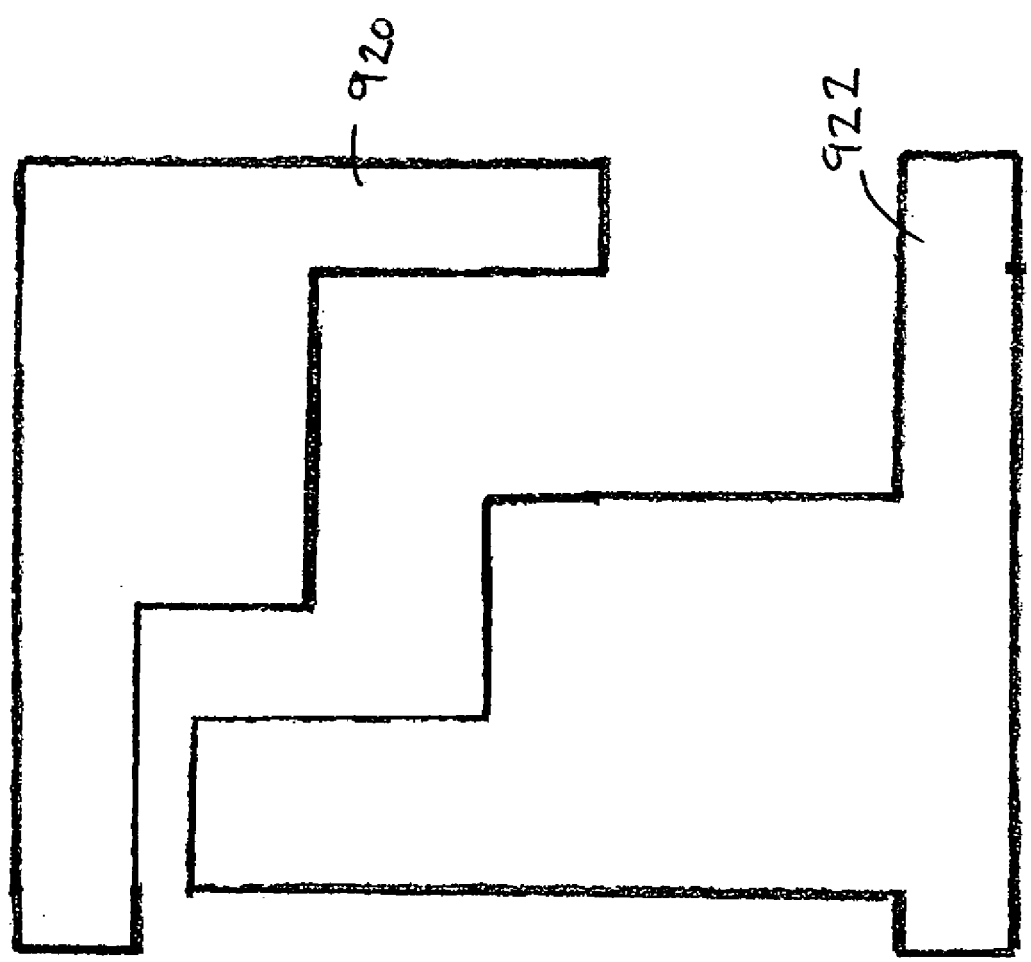

FIG. 13 shows an alternative embodiment for the shapes of first and second REMA blades 920 and 922.

Figure 14:
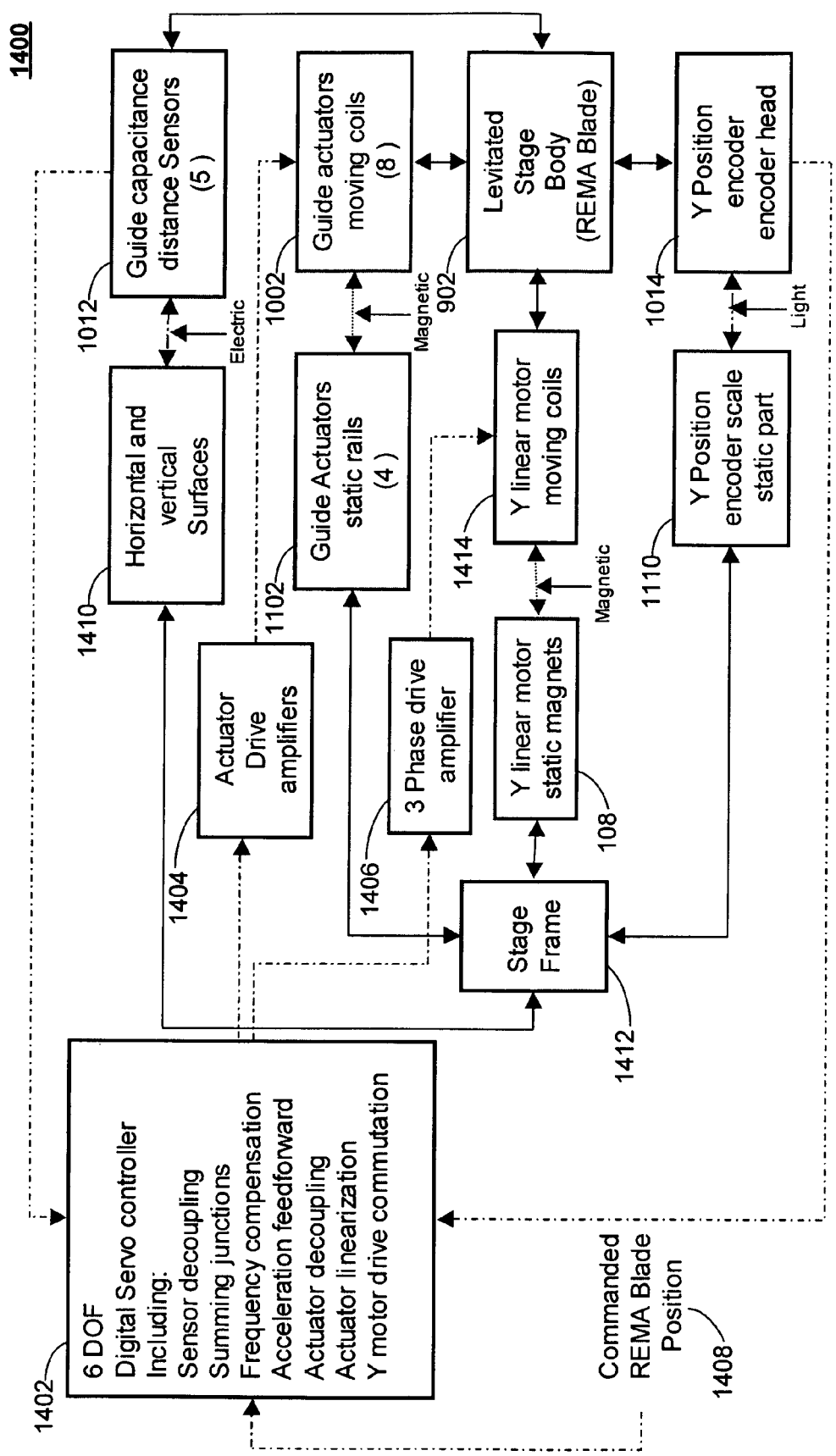

FIG. 14 is a block diagram of an exemplary REMA blade stage system 1400 for linear REMA blade stage mechanism 900.

Figure 15:
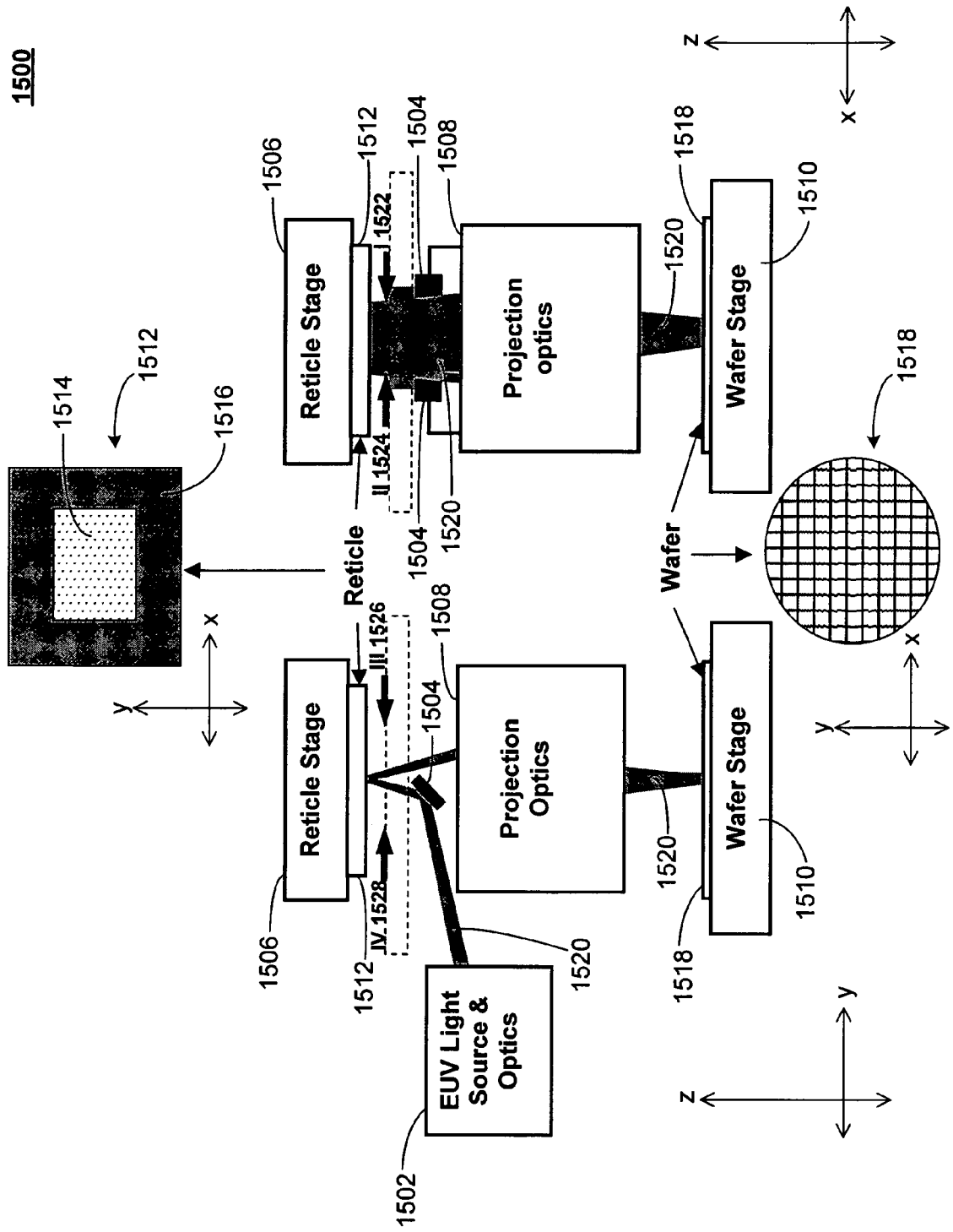

FIG. 15 shows two views of an exemplary EUV projection photolithography system 1500 within which the present invention can be used.

Figure 16:
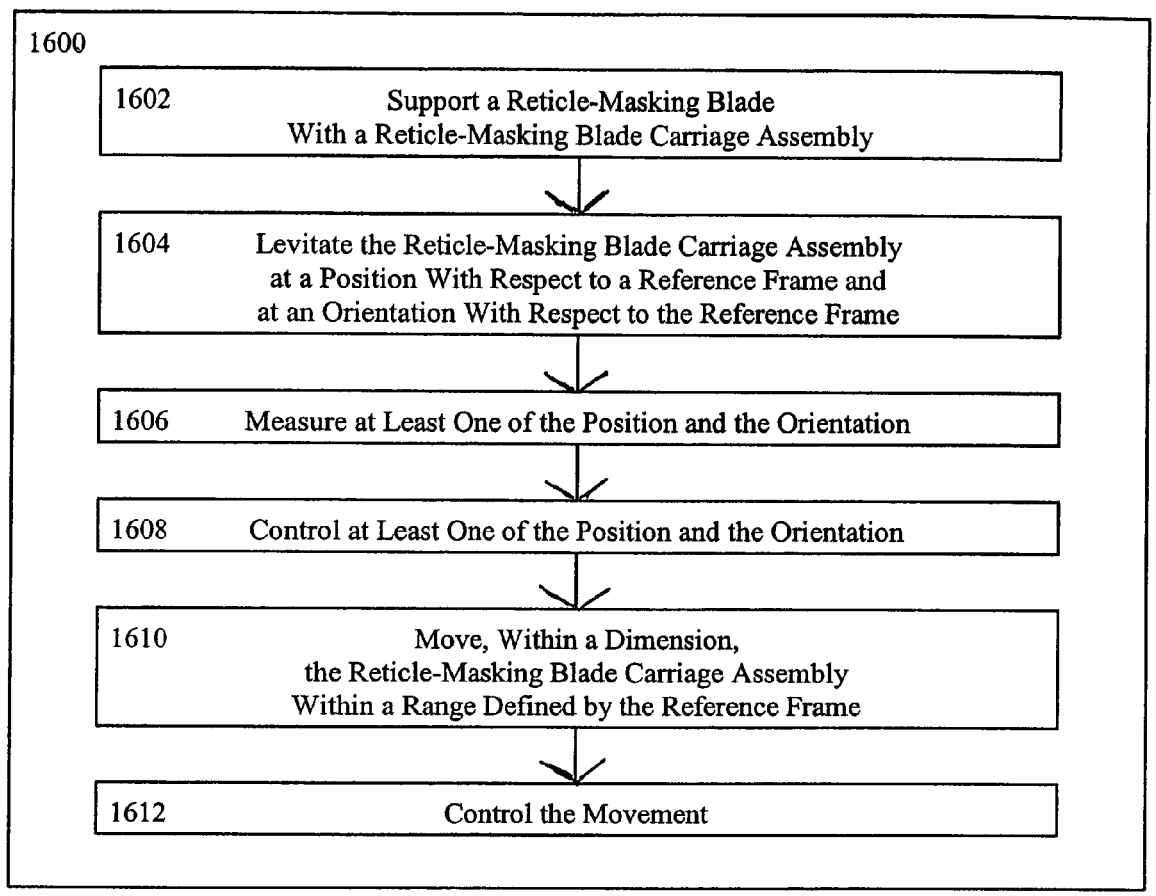

FIG. 16 shows a flow chart of a method 1600 of controlling a REMA blade in a photolithography system.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The use of electromagnetic force in combination with active servomechanism feedback to control the motion of an object in six degrees of freedom is a useful method of achieving what is commonly known as magnetic levitation. The present invention uses this type of magnetic levitation to control the motion of reticle-masking (REMA) blades in six degrees of freedom. The present invention is highly compatible with the high vacuum environment in which the REMA blades of an EUV projection lithography system must operate, and therefore represents a significant improvement over the prior art.

In one embodiment, the present invention can be implemented using four independently levitated REMA blades, wherein each individual REMA blade has a single field defining edge. In this configuration each independently levitated REMA blade has an extended range of motion along one axis. In another embodiment, two independently levitated REMA blades are used, wherein each individual REMA blade has two orthogonal framing edges. In this configuration, each independently levitated REMA blade has extended ranges of motion along two axes.

Magnetic Levitation

Magnetic levitation is achieved when the force produced by the interaction between a first magnetic component attached to a first object and a second magnetic component attached to a second component overcomes another force, such as gravity, that would otherwise cause the first object to be supported by the second object. In this situation, the first object is a levitated object, while the second object is referred to as a reaction frame. All reaction forces associated with the motion of the levitated object appear on the reaction frame. With respect to a ground frame, the reaction frame can be held stationary or allowed to move. A reaction frame that moves in opposition to the movement of the levitated object is a balance mass. The motion of the balance mass acts to cancel the reaction forces that would otherwise be transmitted to the ground frame.

The first and second magnetic components comprise a pair. Typically, one of the magnetic components includes a coil through which a control current is passed. Usually this magnetic component also includes a mechanism to remove heat generated by the current passing through the coil. The other magnetic component generally contains only permanent magnets. The pair of magnetic components forms a magnetic force actuator. If the actuator can support extended motion along a line of force, the device is a magnetic motor. To actively control the motion of the levitated object in six degrees of freedom, the actuator should include at least six independently driven coils.

Magnetic Force Actuators

Lorentz Force Actuators

A first magnetic component comprises a coil. A second magnetic component comprises permanent magnets. The first magnetic component can be attached to a first object and the second magnetic component can be attached to a second object. The coil can be placed within the field generated by the permanent magnets. A constant current passing through the coil interacts with the permanent magnetic field to produce a Lorentz force on the coil and an equal but opposite reaction force on the permanent magnets. The Lorentz force is bipolar and varies linearly with the current passing through the coil.

Figure 1B:
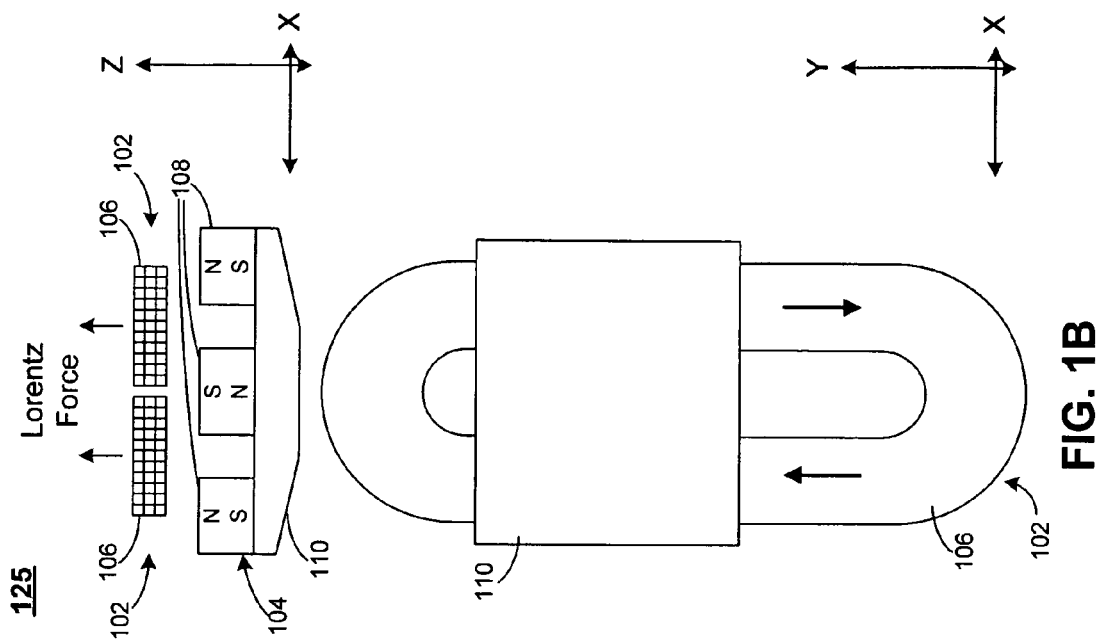
FIGS. 1A through 1D show two views for each of four exemplary Lorentz force actuators 100, 125, 150, and 175.
Figure 1A:
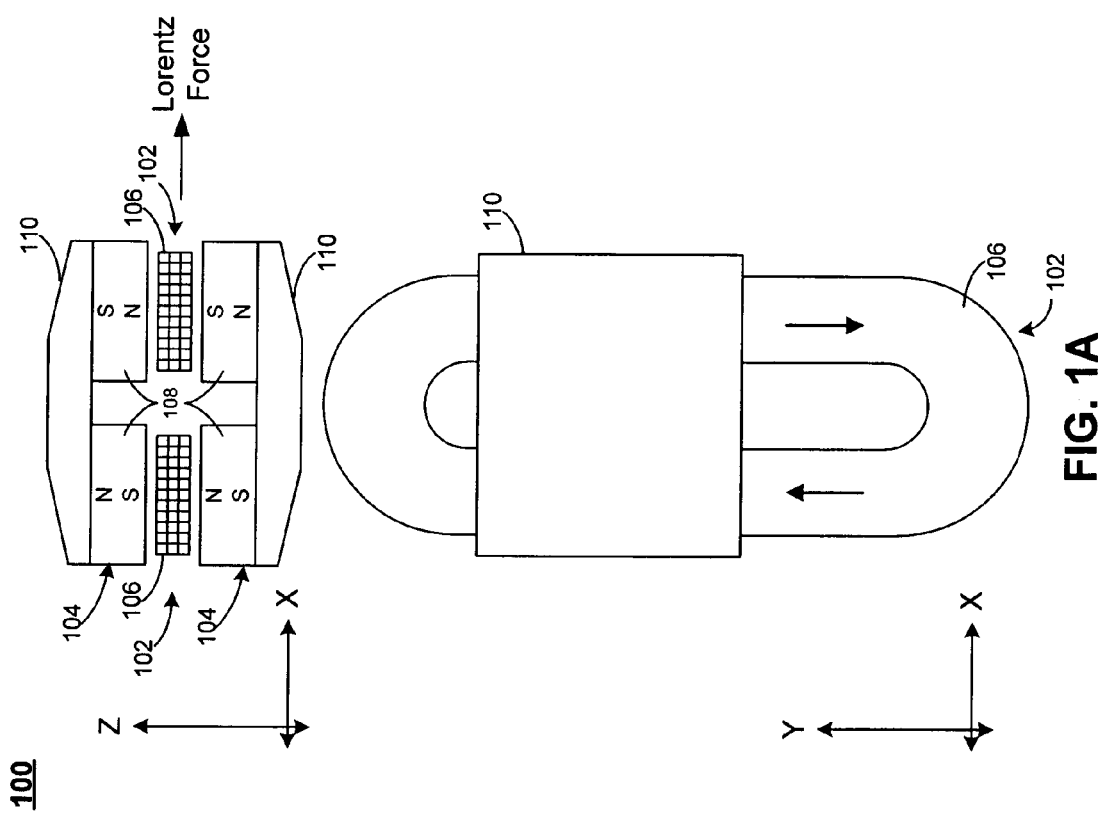

FIGS. 1A and 1B show two views for each of two exemplary Lorentz force actuators 100 and 125. Actuators 100 and 125 each comprise a first magnetic component 102 and a second magnetic component 104. First magnetic component has a coil 106 that can be attached to a first object (not shown). Second magnetic component 104 has permanent magnets 108 that can be attached to a second object (not shown). Actuators 100 and 125 are configured so that usually the second object is capable of being levitated and the first object is capable of functioning as a reaction frame.

Permanent magnets 108 are arranged with poles oriented along a z-axis. The poles of each individual permanent magnet 108 are oriented as shown to generate a strong loop of magnetic flux through coil 106. Actuators 100 and 125 each include an optional back iron 110 that acts to shape the flux of the magnetic field. A constant current passing through coil 106 produces a Lorentz force. In actuator 125, the Lorentz force is directed along the z-axis. In actuator 100, coil 106 is positioned between permanent magnets 108 so that the Lorentz force is directed along an x-axis.

Figure 1C:
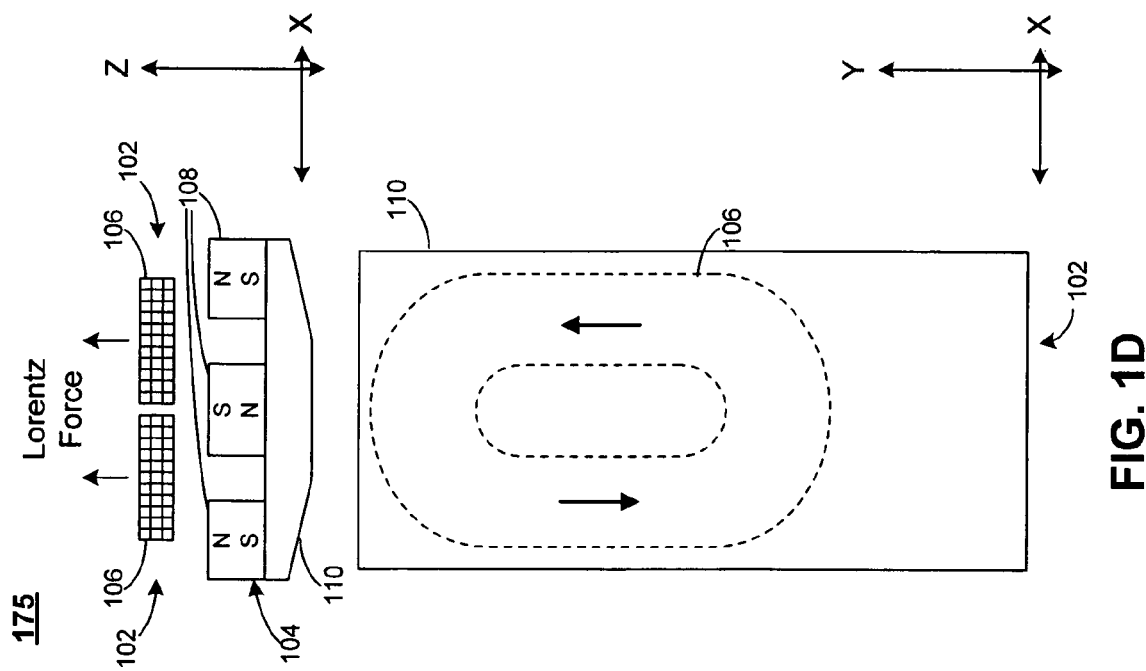
Figure 1D:
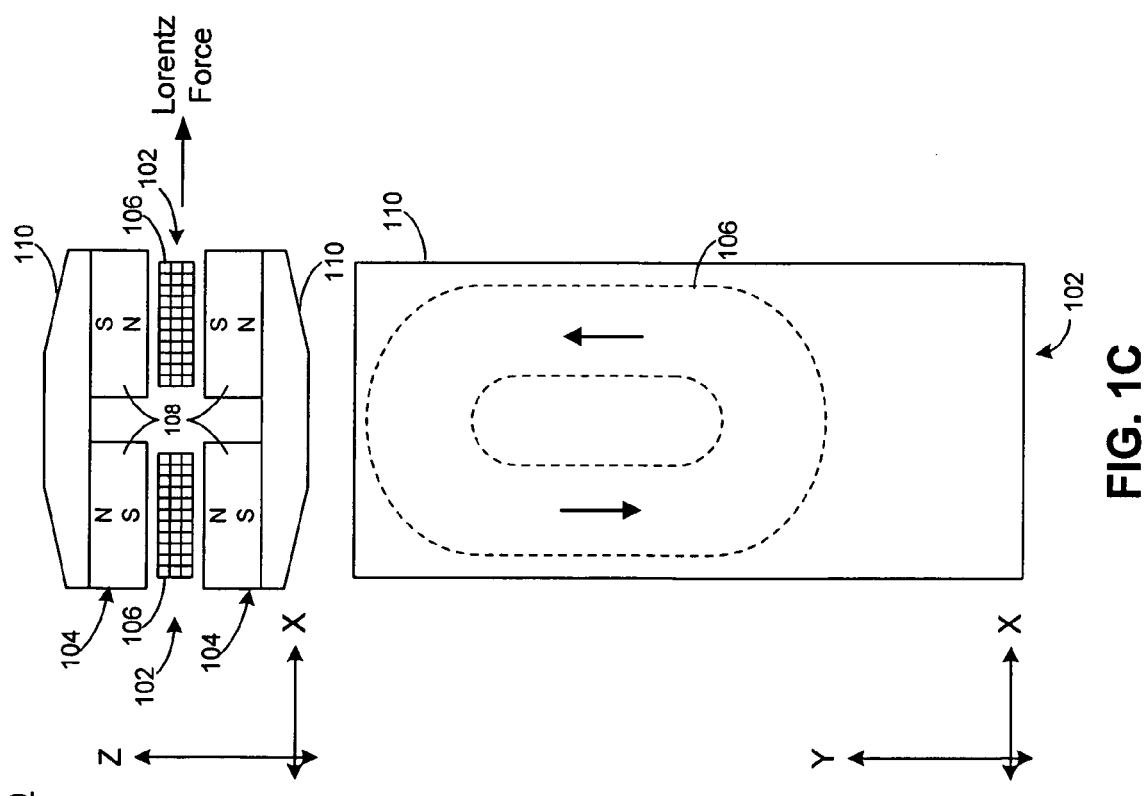

As explained below, a magnetic force actuator can have a range of motion extended along one or more axes. Actuators 100 and 125 are configured with first magnetic component 102 measuring longer than second magnetic component 104 along a y-axis. This facilitates causing first magnetic component 102 to move along the y-axis in relation to second magnetic component 104. In contrast, FIGS. 1C and 1D show two views for each of two exemplary Lorentz force actuators 150 and 175, each of which are configured so that usually the first object is capable of being levitated and the second object is capable of functioning as a reaction frame. Actuators 150 and 175 are configured with second magnetic component 104 measuring longer than first magnetic component 102 along the y-axis. This facilitates causing second magnetic component 104 to move along the y-axis in relation to first magnetic component 102.

Figure 2B:
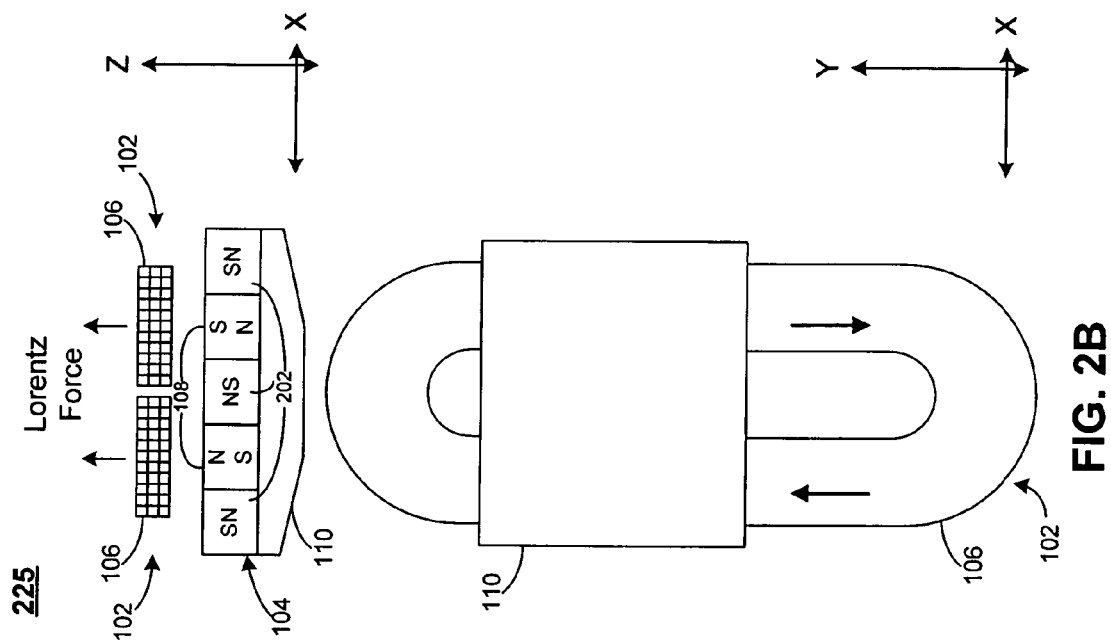
FIGS. 2A and 2B show two views for each of two exemplary Halbach enhanced Lorentz force actuators 200 and 225.
Figure 2A:
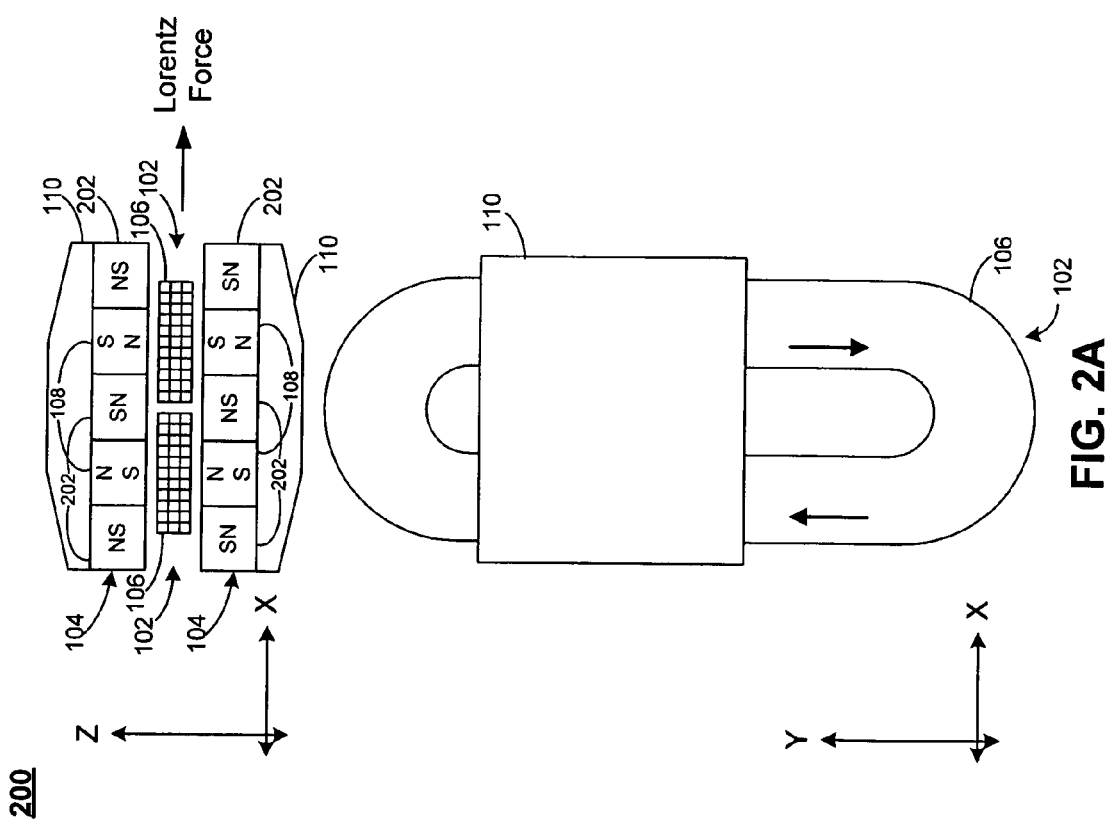

FIGS. 2A and 2B show two views for each of two exemplary Halbach enhanced Lorentz force actuators 200 and 225. Actuators 200 and 225 are each configured in the same manner as, respectively, actuators 100 and 125, but also include Halbach magnets 202. Halbach magnets 202 are positioned between adjacent pairs of permanent magnets 108. Preferably, Halbach magnets 202 encase each of permanent magnets 108. Where a given permanent magnet 108 has a north pole oriented in the direction of the positive z-axis, Halbach magnets 202 that encase the given permanent magnet 108 have north poles directed toward the given permanent magnet 108 along the x-axis. Likewise, where a given permanent magnet 108 has a south pole oriented in the direction of the positive z-axis, Halbach magnets 202 that encase the given permanent magnet 108 have south poles directed toward the given permanent magnet 108 along the x-axis. In comparison with Lorentz force actuators 100 and 125, Halbach magnets 202 enhance the efficiency of Lorentz force actuators 200 and 225.

Reluctance Force Actuators

Alternatively, a first magnetic component comprises a coil wrapped around a highly permeable core. A second magnetic component comprises a highly permeable pole piece. The first magnetic component can be attached to a first object and the second magnetic component can be attached to a second object. Usually, the first object is capable of being levitated and the second object is capable of functioning as a reaction frame. With this actuator configuration, a constant current passing through the coil generates a magnetic field that causes the core and the pole piece to be attracted to each other. Such an actuator is commonly referred to as an electromagnet or a reluctance force actuator. The electromagnetic force is unipolar and varies with the square of the current passing through the coil. Typically, the core and the pole piece are laminated to reduce eddy current losses. The reluctance force actuator can include permanent magnets to bias the flux of the magnetic circuit to improve the efficiency and linearity of the device.

Figure 3A:
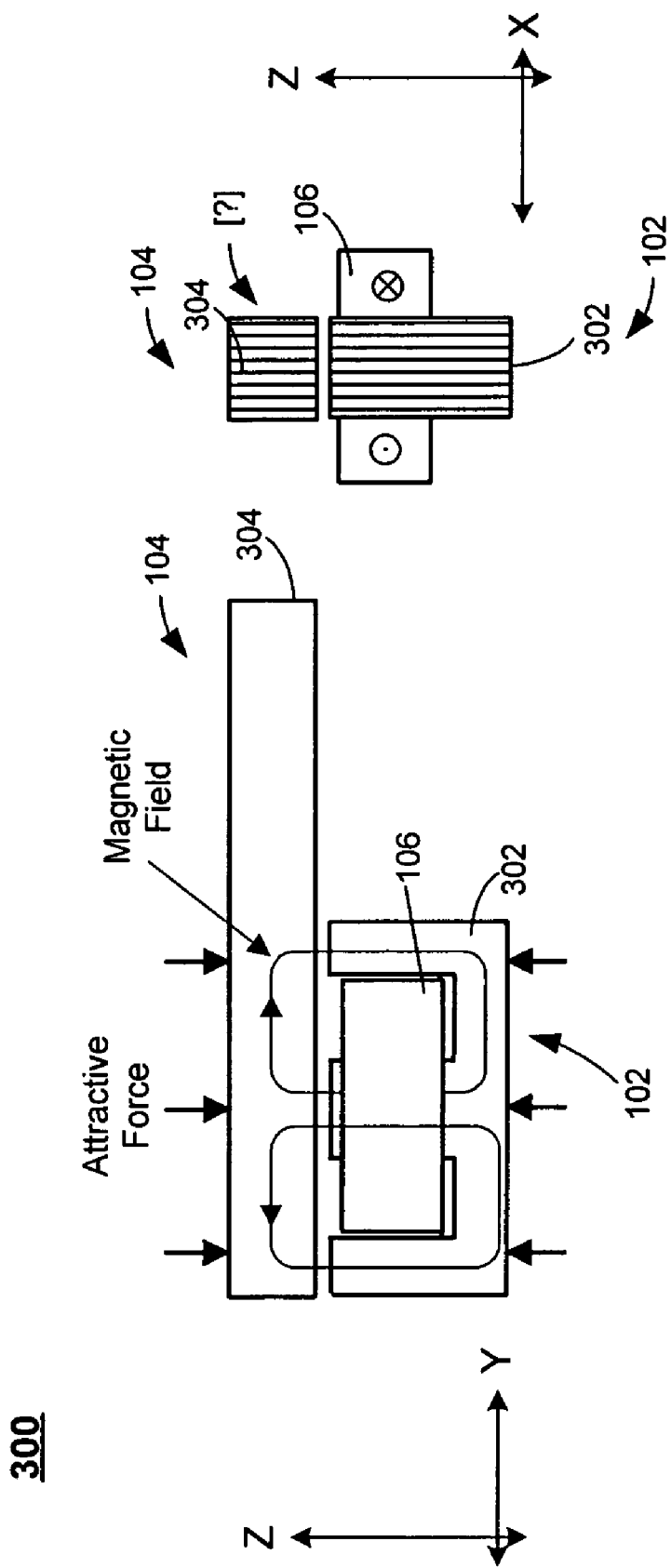

FIGS. 3A and 3B show two views for each of two exemplary reluctance force actuators 300 and 325. Actuators 300 and 325 each comprise first magnetic component 102 and second magnetic component 104. First magnetic component 102 has coil 106 wrapped around a highly permeable core 302 that can be attached to a first object (not shown). Second magnetic component 104 has a highly permeable pole piece 304 that can be attached to a second object (not shown). Usually, the first object is capable of being levitated and the second object is capable of functioning as a reaction frame. In actuator 300, core 302 has an "E" shape with coil 106 wrapped around the center pole. In actuator 325, core 302 has a "C" shape with coil 106 wrapped around the core between the two poles. A constant current passing through coil 106 generates a magnetic field that causes core 302 and pole piece 304 to be attracted to each other. Typically, both core 302 and pole piece 304 are laminated to reduce eddy current losses.

Other Considerations

A variety of magnetic circuit configurations can be employed to increase the force generated for a given actuator mass and to decrease the amount of power dissipated. Where the levitated object needs to be rapidly accelerated, it is desirable to minimize the mass of the levitated object and the power dissipated by the magnetic component of the levitated object. This may cause the reaction frame to have a relatively large mass and the magnetic component of the reaction frame to dissipate a relatively great amount of power. Furthermore, removing heat from coils on a rapidly moving levitated object poses a greater engineering challenge than does removing heat from coils on a slow moving (or stationary) reaction frame.

Magnetic Motors

Initial Considerations

The range of motion of an object levitated with a magnetic force actuator can be extended along one or two axes by using multiple drive coils that interact with an array of magnets in the reaction frame. A magnetic force actuator having a range of motion extended along one axis is a linear magnetic motor. If the range of motion is extended along two axes, the device is a planar magnetic motor. A magnetic motor having a small array of moving coils that interacts with a relatively stationary large array of permanent magnets is a moving coil motor. Conversely, a magnetic motor having a small array of moving permanent magnets that interacts with a relatively stationary large array of coils is a moving magnet motor.

To generate a relatively constant drive force in the direction of the axes of extended range of motion, currents must be commutated from one drive coil to another based upon the position of the levitated object with respect to the reaction frame. In the present invention, commutation is preferably accomplished by applying varying currents, preferably sinusoidal, to the drive coils. Where the drive coils are arranged in a linear array, the sinusoidal current through each drive coil is +120 degrees out of phase with the sinusoidal current through the drive current adjacent on one side, and −120 degrees out of phase with the sinusoidal current through the drive current adjacent on the other side. The overall force is proportional to the peak drive current.

Moving Coil Motors

Figure 4:
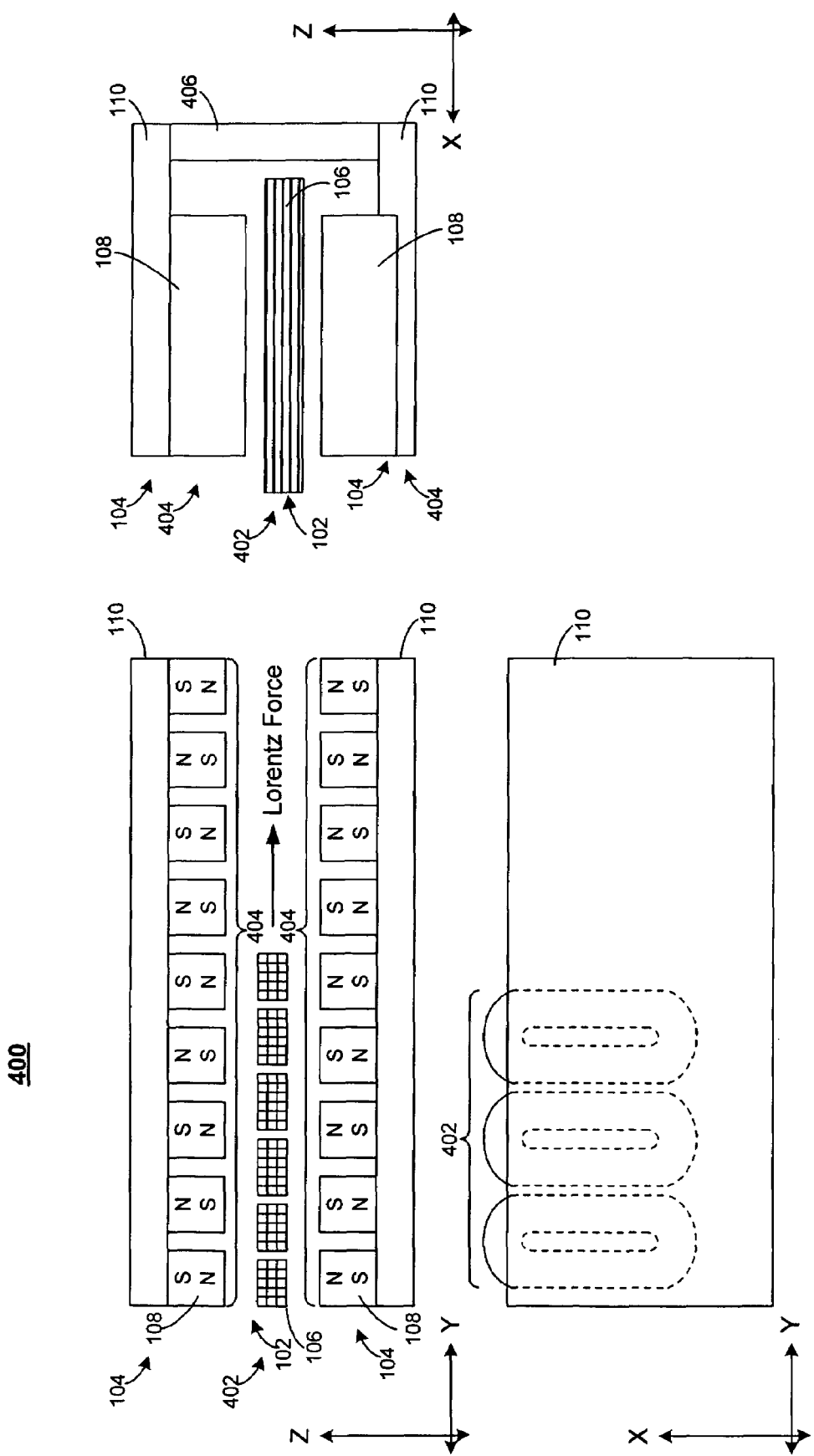
FIG. 4 shows three views for a Lorentz force moving coil linear motor 400.

FIG. 4 shows three views for a Lorentz force moving coil linear motor 400. Motor 400 comprises first and second magnetic components 102 and 104. First magnetic component 102 has a relatively short array 402 of coils 106. Second magnetic component 104 has relatively long arrays 404 of permanent magnets 108. Optional back iron 110 is desirable to maintain an efficient magnetic circuit that enhances the flux passing through array 402 of coils 106. First magnetic component 102 can be attached to a first object (not shown) that is capable of being levitated. Second magnetic component 104 can be attached to a second object (not shown) and a third object (not shown) that are capable of functioning as a reaction frame. The second and third objects can be connected together by a structural element 406 such that motor 400 is a U-channel motor. Varying currents, preferably sinusoidal, can be applied to coils 106 as described above. Where coils 106 are used both to levitate and to drive the first object, the varying currents used to produce the drive force can be offset by the constant current used to produce the levitation force. The varying currents generate a relatively constant drive force in a direction along the y-axis. This drive force causes the first object, with first magnetic component 102, to move in relation to the second and third objects, with second magnetic component 104. However, to actively control the motion of the first object in six degrees of freedom, motor 400 must employ at least five additional magnetic force actuators (not shown) to guide the first object in relation to the second and third objects.

Figure 5:
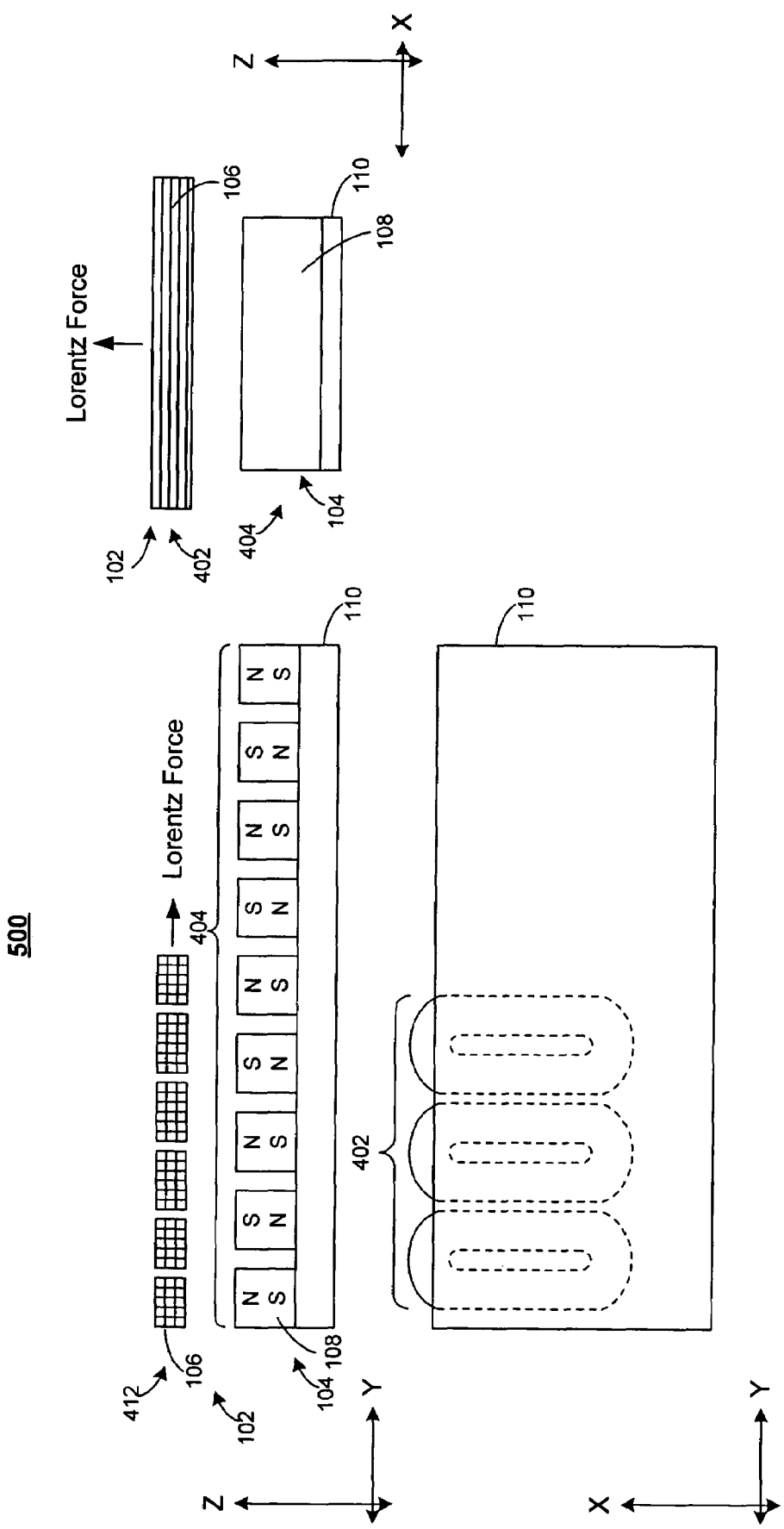
FIG. 5 shows three views for a Lorentz force moving coil linear motor 500.

FIG. 5 shows three views for a Lorentz force moving coil linear motor 500. Motor 500 comprises first and second magnetic components 102 and 104. First magnetic component has relatively short array 402 of coils 106. Second magnetic component 104 has relatively long array 404 of permanent magnets 108. Optional back iron 110 is desirable to maintain an efficient magnetic circuit that enhances the flux passing through array 402 of coils 106. First magnetic component 102 can be attached to a first object (not shown) that is capable of being levitated. Second magnetic component 104 can be attached to a second object (not shown) that is capable of functioning as a reaction frame. Varying currents, preferably sinusoidal, can be applied to coils 106 as described above. Where coils 106 are used both to levitate and to drive the first object, the varying currents used to produce the drive force can be offset by the constant current used to produce the levitation force. The varying currents generate a relatively constant drive force in a direction along the y-axis. This drive force causes the first object, with first magnetic component 102, to move in relation to the second object, with second magnetic component 104. However, first and second magnetic components 102 and 104 also act to direct the Lorentz force along the z-axis. This Lorentz force can be used to guide the first object with respect to the z-axis. If multiple linear motors configured as motor 500 are used to drive the first object, other Lorentz forces can be produced along other axes so that the number of additional magnetic force actuators needed to guide the first object in relation to the second object can be reduced or eliminated.

Figure 6:
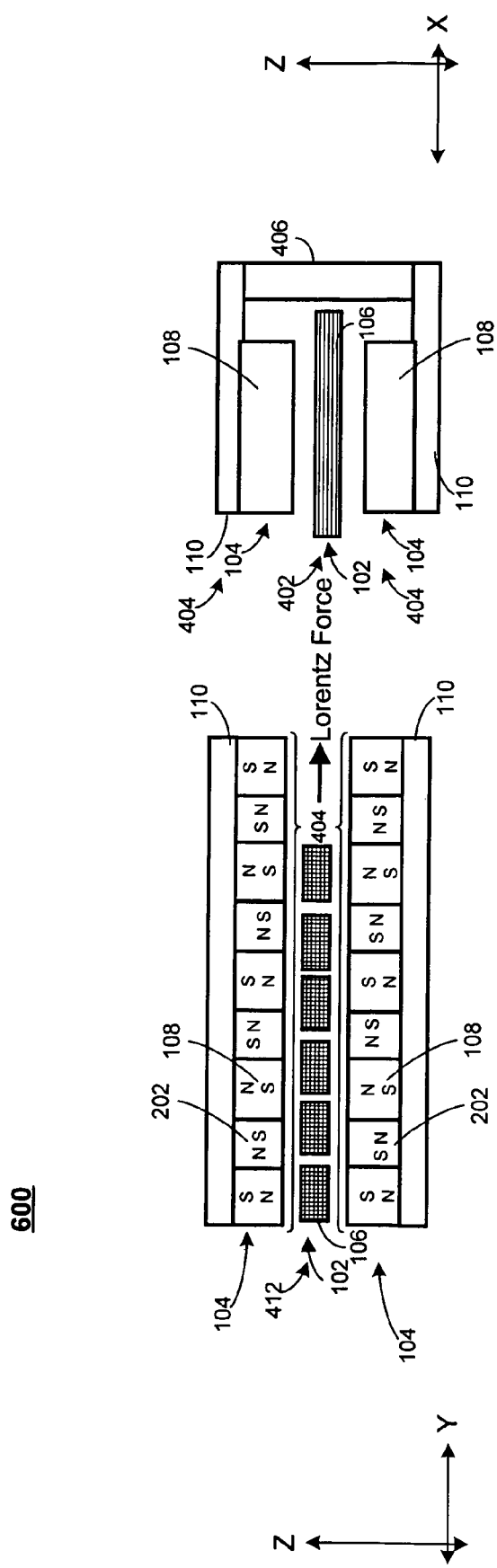
FIG. 6 shows two views for a Halbach enhanced Lorentz force moving coil linear motor 600.

FIG. 6 shows two views for a Halbach enhanced version of the Lorentz force linear motor 600. Motor 600 is configured in the same manner as motor 400, but also include Halbach magnets 202. The use of Halbach magnets 202 can increase the drive force and can reduce or eliminate the need for back iron 110. Alternatively, a Halbach enhanced Lorentz force moving coil linear motor can be configured in the same manner as motor 500, but also include Halbach magnets 202. Generally, Halbach magnets 202 are more effective in such single-sided arrays.

Moving Magnet Motors

Figure 7:
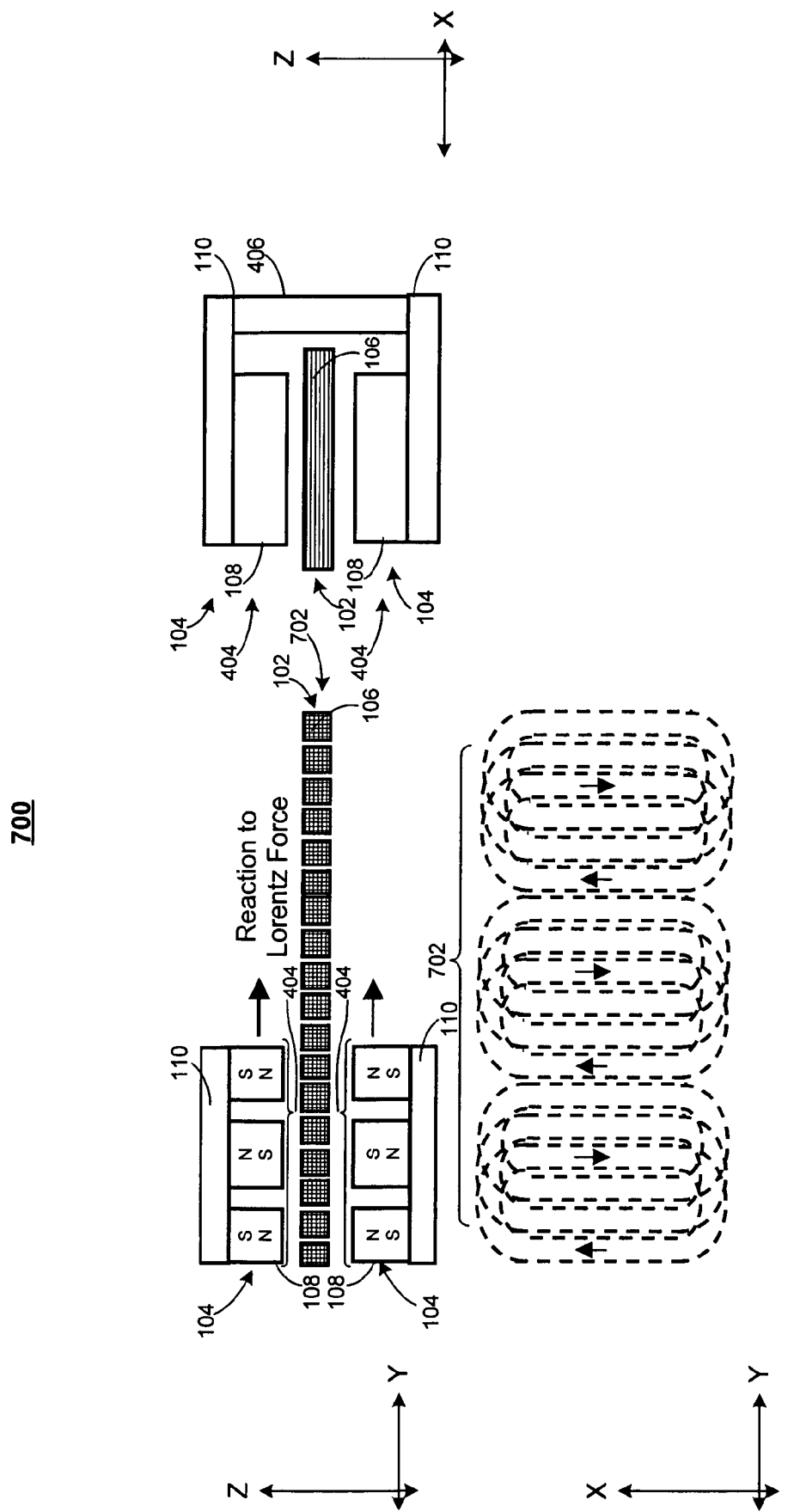
FIG. 7 shows three views for a Lorentz force moving magnet linear motor 700.

FIG. 7 shows three views for a Lorentz force moving magnet linear motor 700. Motor 700 comprises first and second magnetic components 102 and 104. First magnetic component 102 has a relatively long array 702 of coils 106. Second magnetic component 104 has relatively short arrays 704 of permanent magnets 108. Optional back iron 110 is desirable to maintain an efficient magnetic circuit that enhances the flux passing through array 702 of coils 106. First magnetic component 102 can be attached to a first object (not shown) that is capable of functioning as a reaction frame. Second magnetic component 104 can be attached to a second object (not shown) and a third object (not shown) that are capable of being levitated. The second and third objects can be connected together by structural element 406 such that motor 700 is a U-channel motor. Varying currents, preferably sinusoidal, can be applied to coils 106 as described above. Where coils 106 are used both to levitate and to drive the second and third objects, the varying currents used to produce the drive force can be offset by the constant current used to produce the levitation force. The varying currents generate a relatively constant drive force in a direction along the y-axis. In reaction to this drive force, the second and third objects, with second magnetic components 104, move in relation to the first object, with first magnetic component 102. However, to actively control the motion of the second and third objects in six degrees of freedom, motor 700 must employ at least five additional magnetic force actuators (not shown) to guide the second and third objects in relation to the first object. Array 702 of coils 106 can be configured so that coils 106 are overlapped. This can reduce the number of permanent magnets 108 in second magnetic component 104.

Planar Magnetic Motors

Figure 8:
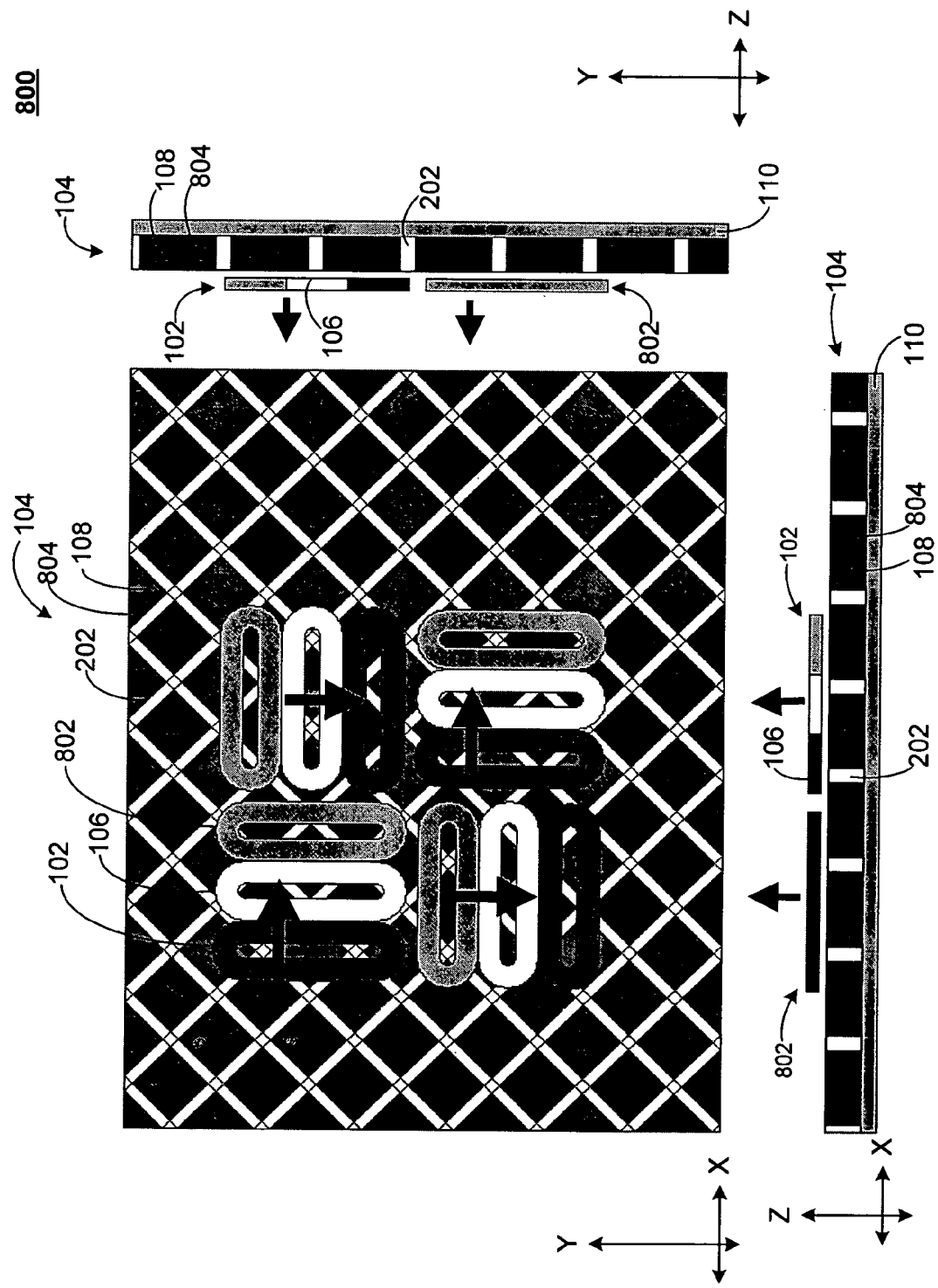
FIG. 8 shows three views for a Halbach enhanced Lorentz force moving coil planar motor 800.

FIG. 8 shows three views for a Halbach enhanced Lorentz force moving coil planar motor 800. Motor 800 comprises first and second magnetic components 102 and 104. First magnetic component 102 has four groups 802 each with three coils 106. For each given coil group 802, an adjacent coil group 802 is oriented orthogonal to the given coil group 802. Preferably, each coil 106 is a flat coil. Second magnetic component 104 has a relatively large array 804 of permanent magnets 108. Array 804 of permanent magnets 108 is a two dimensional array. Preferably, array 804 is a checkerboard array. Preferably, array 804 includes Halbach magnets 202. First magnetic component 102 can be attached to a first object (not shown) that is capable of being levitated. Second magnetic component 104 can be attached to a second object (not shown) that is capable of functioning as a reaction frame.

Varying currents, preferably sinusoidal, can be applied to coils 106 as described above. Where coils 106 are used both to levitate and to drive the first object, the varying currents used to produce the drive force can be offset by the constant current used to produce the levitation force. The varying currents generate a relatively constant drive force in a direction within the x-y plane. This drive force is the vector sum of individual drive forces produced by each coil group 802. The drive force causes first object, with first magnetic component 102, to move in relation to the second object, with second magnetic component 104.

Additionally, coil groups 802 of coils 106 and array 804 of permanent magnets 108 act to direct the Lorentz force along the z-axis. This Lorentz force can be used to guide the first object with respect to the z-axis. With properly phased commutation of the currents to coils 106, motor 800 can provide forces to support six degrees of freedom of motion to levitate the first object.

Linear REMA Blade Stage Mechanism

The present invention recognizes that many combinations of magnetic force actuators and motors can be used to levitate and to drive REMA blades. Of special interest is the case where the movements of two parallel REMA blades need to be independently controlled over an overlapping range of travel. Rather than drive each REMA blade with completely separate magnetic force actuators and motors, the present invention recognizes that each REMA blade can be coupled to a moving portion of a magnetic motor and that the moving portions of each magnetic motor can be coupled to a common reaction portion.

Figure 9:
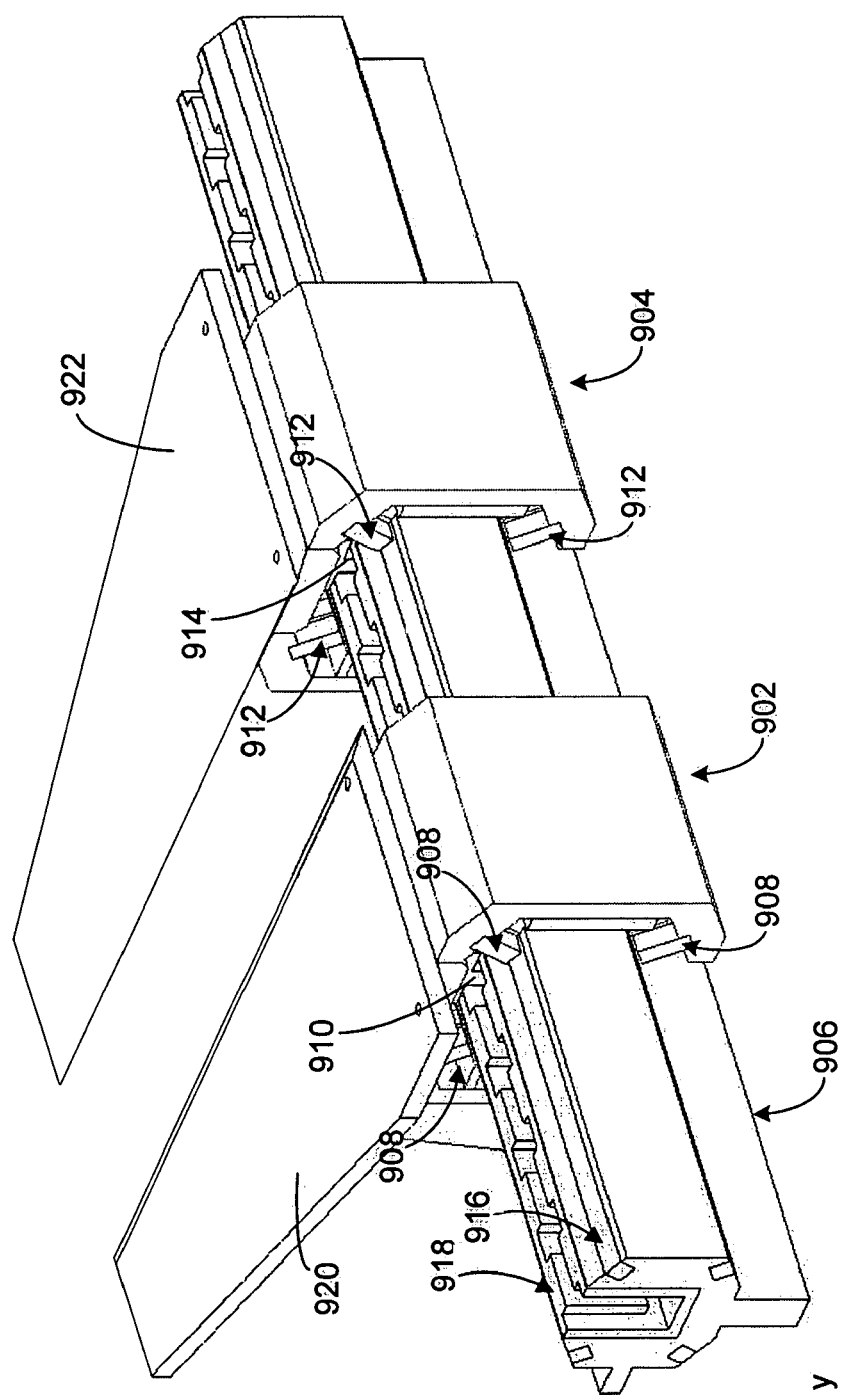
FIG. 9 shows a linear REMA blade stage mechanism 900 in the manner of the present invention.

FIG. 9 shows a linear REMA blade stage mechanism 900 in the manner of the present invention. Linear REMA blade stage mechanism 900 comprises a first object 902, an optional second object 904, and a third object 906. First object 902 has a first magnetic levitation component 908 and a first magnetic drive component 910. Second object 904 has a second magnetic levitation component 912 and a second magnetic drive component 914. Third object 906 has a third magnetic levitation component 916 and a third magnetic drive component 918. First and second objects 902 and 904 are capable of being levitated. Third object 906 is capable of functioning as a reaction frame. A first REMA blade 920 is coupled to first object 902 and a second REMA blade 922 is coupled to second object 904. First and second REMA blades 920 and 922 comprise a pair of parallel REMA blades. Each of first and second magnetic drive components 910 and 914 has an array of drive coils. Varying currents, preferably sinusoidal, can be applied to the coils in each array as described above. The varying currents generate relatively constant drive forces in a direction along the y-axis. Varying currents applied to each array are independently controlled so that movement of first and second objects 902 and 904 are independent of one another.

FIG. 10 shows first object 902 (levitated object) with first REMA blade 920 of linear REMA blade stage mechanism 900. First object 902 has first magnetic levitation component 908 and first magnetic drive component 910. First magnetic levitation component 908 comprises eight levitation subcomponents 1002 (five of which are shown in FIG. 10). Each levitation subcomponent 1002 is configured in the same manner as is first magnetic component 102 of actuator 300 described above with reference to FIG. 3A. Each levitation subcomponent 1002 has a coil wrapped around the center pole of a highly permeable, E-shaped core. A constant current passing through the coil in each levitation subcomponent 1002 causes it to be attracted to a corresponding reaction subcomponent (not shown). Each levitation subcomponent 1002 is one of a pair of levitation subcomponents 1002: "A" 1004, "B" 1006, "C", 1008, and "D" 1010. Each pair of levitation subcomponents 1002 is oriented radially inward. Each pair of levitation subcomponents 1002 has a corresponding opposite pair of levitation subcomponents 1002: A 1004 is opposite C 1008, and B 1006 is opposite D 1010. First magnetic drive component 910 is configured in the same manner as is first magnetic component 102 of motor 400 described above with reference to FIG. 4. First magnetic drive component 910 has an array of coils.

FIG. 11 shows third object 906 (reaction frame) of linear REMA blade stage mechanism 900. Third object 906 has third magnetic levitation component 916 and third magnetic drive component 918. Third magnetic drive component 918 has two arrays of permanent magnets configured in the same manner as is second magnetic component 104 of motor 400 described above with reference to FIG. 4. The arrays are connected together by structural element 406 to form a U-channel. To actively control the motion of first object 902 (shown in FIG. 10) in six degrees of freedom, third magnetic levitation component 916 comprises four reaction subcomponents 1102. Each reaction subcomponent 1102 is configured in the same manner as is second magnetic component 104 of actuator 300 described above with reference to FIG. 3A. Each reaction subcomponent 1102 has a highly permeable pole piece. Each reaction subcomponent 1102 corresponds to a pair of levitation subcomponents 1002 shown in FIG. 10: "a" 1104 corresponds to A 1004, "b" 1106 corresponds to B 1006, "c" 1108 corresponds to C 1008, and "d" 1110 corresponds to D 1010. Each reaction subcomponent 1102 and its corresponding pair of levitation subcomponents 1002 comprise a magnetic force actuator group. Thus, linear REMA blade stage mechanism 900 has, for each of first and second objects 902 and 904, four magnetic force actuator groups. A constant current passing through the coils in each pair of levitation subcomponents 1002 causes it to be attracted to its corresponding reaction subcomponent 1102. Because the attractive force of each magnetic force actuator group is directed radially inward, the attractive forces of opposite magnetic force actuator groups balance each other. This causes first object 902 to levitate with respect to third object 906, and guides movement of first object 902 along the y-axis. Second object 904 can likewise be levitated and driven.

Alternatively, levitation and reaction subcomponents 1002 and 1102 can be realized using C-shaped reluctance force actuators (e.g., actuator 325), Lorentz force actuators (e.g., actuators 100, 125, 150, 175, 200, or 225), Lorentz force motors (e.g., 500 or 600), or a combination of these. A second linear REMA blade stage mechanism, configured in the same or a similar manner as linear REMA blade stage mechanism 900, can be used to levitate and drive a second pair of parallel REMA blades. The second pair of parallel REMA blades can be oriented orthogonal to the first pair of parallel REMA blades.

Planar REMA Blade Stage Mechanism

FIG. 12 shows a planar REMA blade stage mechanism 1200 in the manner of the present invention. Planar REMA blade stage mechanism 1200 comprises a first object 1202, an optional second object 1204, and a third object 1206. First object 1202 has a first magnetic component 1208. Second object 1204 has a second magnetic component 1210. Third object 1206 has a third magnetic component 1212. First and second objects 1202 and 1204 are capable of being levitated. Third object 1206 is capable of functioning as a reaction frame. First REMA blade 920 is coupled to first object 1202 and second REMA blade 922 is coupled to second object 1204.

Each of first and second magnetic components 1208 and 1210 is configured in the same manner as is first magnetic component 102 of motor 800 as described above with reference to FIG. 8. Each of first and second magnetic components 1208 and 1210 has four coil groups each with three coils (not shown). For each given coil group, an adjacent coil group is oriented orthogonal to the given coil group. Preferably, each coil is a flat coil.

Third magnetic component 1212 is configured in the same manner as is second magnetic component 104 of motor 800 as described above with reference to FIG. 8. Third magnetic component has a relatively large array of permanent magnets (not shown). The array of permanent magnets is a two dimensional array. Preferably, the array is a checkerboard array. Preferably, the array includes Halbach magnets.

Varying currents, preferably sinusoidal, can be applied to the coils as described above. The coils are used both to levitate and to drive first and second objects 1202 and 1204. For each of first and second objects 1202 and 1204, varying currents used to produce the drive force are offset by the constant current used to produce the levitation force. The varying currents generate a relatively constant drive force within the x-y plane. This drive force is the vector sum of individual drive forces produced by each coil group. The drive forces cause first object 1202, with first magnetic component 1208, and second object 1204, with second magnetic component 1210, to move in relation to third object 1206, with third magnetic component 1212.

Additionally, the groups of coils in first and second magnetic components 1208 and 1210 and the array of permanent magnets in third magnetic component 1212 act to direct the Lorentz force along the z-axis. This Lorentz force is used to guide first and second objects 1202 and 1204 with respect to the z-axis. With properly phased commutation of the current to the coils, forces are provided to support six degrees of freedom of motion to levitate first and second objects 1202 and 1204. First and second magnetic components 1208 and 1210 are independently controlled so that movements of first and second REMA blades 920 and 922 are independent of one another.

First object 1202 can be configured to levitate at a first height and second object 1204 can be configured to levitate at a second height. Alternatively, first REMA blade 920 can be configured to levitate at a different height from second REMA blade 922 when first object 1202 and second object 1204 levitate at the same height. Thus, planar REMA blade stage mechanism 1200 is capable of driving first and second REMA blades 920 and 922 so that they overlap rather than contact each other.

Each of first and second REMA blades 920 and 922 is shaped to support delimitation of the exposed field in two dimensions. For example, first REMA blade 920 can have an "L" shape, while second REMA blade 922 can have a "T" shape. Alternatively, as shown in FIG. 13, first REMA blade 920 can have a first "staircase" shape and second REMA blade 922 can have a second staircase shape. Advantageously, these configurations preclude the need for a second pair of REMA blades and their associated blade stage mechanisms. First and second REMA blades 920 and 922 are capable of being positioned to produce a variety of exposed field shapes. The skilled artisan will appreciate other shapes for each of first and second REMA blades 920 and 922.

REMA Blade Stage Mechanism Support Systems
Position Sensors

Active magnetic levitation requires that the relative position between the levitated object and a reference frame be measured by relative position sensors in six degrees of freedom. FIGS. 10 and 11 show an exemplary position sensor system configuration for linear REMA blade stage mechanism 900. In FIG. 10, first (levitated) object 902 also comprises five capacitance gauges 1012 (three of which are shown in FIG. 10) and an optical encoder 1014. The five capacitance gauges 1012 provide sufficient data to guide first object 902 so that it follows a linear path. Optical encoder 1014 provides position data along the path of motion of first object 902. Although first object 902 includes five capacitance gauges 1012, only three capacitance gauges 1012 are needed to provide the necessary guidance to support levitation of first object 902. Optical encoder 1014 is an encoder head. The encoder head works in conjunction with an encoder tape 1112 shown in FIG. 11.

Alternatively, guidance for first object 902 can be provided by eddy current sensors, electro-optical sensors with light emitting diodes, laser sources and photodiodes, or the like. Alternatively, position data can be provided by laser interferometers, non-optical encoders (such as Hall effect sensors interacting with a periodic array of permanent or linear resolvers), or the like.

Servomechanism Control

Controlling levitation and motion of first object 902 in linear REMA blade stage mechanism 900 requires a real time, multiple axes servomechanism controller. Via an iterative feedback loop process, the digital servomechanism controller: (1) accepts signals from sensors (e.g., capacitance gauges 1012) that monitor the six degrees of freedom of first object 902, (2) decouples position sensor (e.g., optical encoder 1014) data into orthogonal coordinates, (3) subtracts the actual position of first object 902 from a desired position to obtain a position error signal, (4) filters and frequency compensates the position error signal to obtain a drive signal proportional to the decoupled control forces, (5) sums an acceleration feed forward for axes along which first object 902 has an extended range of motion based upon an expected motion profile of a given axis, (6) decouples the drive signal into separate actuator and motor drive signals, and (7) generates actuator coil currents and motor drive coil currents to produce the desired forces. For reluctance force actuators, the process of generating the coil currents includes non-linear processing to account for the non-linear response of these types of actuators. The servomechanism controller process enables first object 902 to accurately follow command positions and the motion profile. Preferably, the servomechanism controller is a digital servomechanism controller.

FIG. 14 is a block diagram of an exemplary REMA blade stage system 1400 for linear REMA blade stage mechanism 900. System 1400 comprises a servomechanism controller 1402, actuator drive amplifiers 1404, and a three-phase drive amplifier 1406.

Servomechanism controller 1402 accepts signals from the five capacitance gauges 1012 (e.g., guide capacitance distance sensors), the encoder head of optical encoder 1014 (e.g., Y position encoder encoder head), and a commanded REMA blade position 1408. The five capacitance gauges 1012 sense the distance of first object 902 (e.g., levitated stage body) from horizontal and vertical surfaces 1410 of third (reaction frame) object 906 (e.g., stage frame 1412). The encoder head of optical encoder 1014 works in conjunction with encoder tape 1110 (e.g., Y position encoder scale static part) to provide position data along the path of motion of first object 902.

Servomechanism controller 1402 provides signals to actuator drive amplifiers 1404 and three-phase drive amplifier 1406. Actuator drive amplifiers 1404 generate actuator coil currents for each levitation subcomponent 1002 (e.g., guide actuators moving coils). Current passing through coils in each pair of levitation subcomponent 1002 causes it to be attracted to its corresponding reaction subcomponent 1102 (e.g., guide actuator static rails). Three-phase drive amplifier 1406 generates motor drive coil current for the three-phase drive coil of first magnetic drive component 910 (e.g., Y linear motor moving coils 1414). The three-phase drive coil generates a relatively constant drive force in a direction along the y-axis. This drive force causes first object 902 to move in relation to third object 906, which have a large array of permanent magnets 108 (e.g., Y linear motor static magnets).

Power Dissipation and Heat Removal

A magnetic force actuator dissipates power in its coils proportional to the square of the current drawn by the coils. For REMA blades that must be synchronized to the scanning motion of the reticle, requirements for acceleration can increase power dissipation in the motor. For a REMA blade operating in a vacuum and driven by a moving coil motor, heat generated by the motor coils can possibly cause the temperature of the levitated assembly to rise to an unacceptable level. This problem can be compounded by exposing energy that is absorbed by the REMA blade. Heat generated under these effects must be efficiently radiated to another structure, transferred to a heat removal medium, or both. The heat removal medium can be a liquid, a gas, or both. Use of such a heat removal medium requires a heat removal mechanism. Usually the heat removal mechanism uses flexible tubes connected to support circulation of the heat removal medium between the heat source (i.e., the moving coil motor coils, the REMA blade, or both) and a heat sink. Alternatively, for a REMA blade driven by a moving magnet motor, the heat removal mechanism can be connected to support circulation of the heat removal medium between the coils on the relatively slow moving (or stationary) reaction frame and a heat sink. Advantageously, such a heat removal mechanism can be configured without flexible tubes.

Furthermore, magnetic forces generated by permanent magnetic fields can be used to offset the weight of a levitated object and thus reduce the current drawn by the coils to maintain the position of the object. Power dissipation due to acceleration forces can be minimized by using magnetic force actuators and motors with high values of steepness (i.e., force$^2$/power) and by minimizing the mass of the moving portion of the motor.

Exemplary EUV Projection Photolithography System

FIG. 15 shows two views of an exemplary EUV projection photolithography system 1500 within which the present invention can be used. One view is in the y-z plane, the other view is in the x-z plane. System 1500 comprises an EUV light source and associated illumination optics 1502, a mirror 1504, a reticle stage 1506, projection optics 1508, and a wafer stage 1510. Reticle stage 1506 supports a reflective reticle 1512. Reflective reticle 1512 is characterized by a patterned area 1514 and a border area 1516. Wafer stage 1510 supports a wafer 1518. (FIG. 15 also includes views of reflective reticle 1512 and wafer 1518 in the x-y plane.) EUV light source 1502 projects an illumination beam 1520, which via mirror 1504 is used to illuminate reflective reticle 1512 so that patterned area 1514 of reflective reticle 1512 is transferred through projection optics 1508 and into a photoresist (not shown) applied to wafer 1518.

System 1500 also comprises four independently movable REMA blades: "I" 1522, "II" 1524, "III" 1526, and "IV" 1528 configured as two pairs. One pair of REMA blades (i.e., I 1522 and II 1524) have edges that are aligned parallel to the scan axis (e.g., the y-axis). This first pair remains stationary during the exposure scan and delimits the width of the exposed field. A second pair of REMA blades (i.e., III 1526 and IV 1528) have edges that are aligned parallel to the step axis (e.g., the x-axis). This second pair moves synchronously with reflective reticle 1512 and delimits the length of the exposed field.

Method of Controlling a REMA Blade

FIG. 16 shows a flow chart of a method 1600 of controlling a REMA blade in a photolithography system. In method 1600, at a step 1602, a REMA blade is supported with a REMA blade carriage assembly. At a step 1604, the REMA blade carriage assembly is levitated at a position with respect to a reference frame and at an orientation with respect to the reference frame. Preferably, the REMA blade carriage assembly is electromagnetically levitated, but the present invention is not limited to this mode of levitation. The present invention can also be realized, for example, by electrostatic levitation.

At a step 1606, at least one of the position and the orientation of the REMA blade carriage assembly is measured. At a step 1608, at least one of the position and the orientation of the REMA blade carriage assembly is controlled. Preferably, the position and the orientation of the REMA blade carriage assembly is controlled with six degrees of freedom of motion. The position and the orientation of the REMA blade carriage assembly can be controlled by: (1) sending a first signal, that corresponds to a measure of at least one of the position and the orientation of the REMA blade carriage assembly, to a first component, that performs the controlling and (2) receiving, from the first component, a second signal at a second component that causes the levitating.

Optionally, at a step 1610, the REMA blade carriage assembly is moved within a dimension within a range defined by the reference frame. The dimension can be two dimensions. Optionally, at a step 1612, the movement of the REMA blade carriage assembly is controlled. The movement of the REMA blade carriage assembly can be controlled by: (1) sending a first signal, that corresponds to a measure of at least one of the position and the orientation of the REMA blade carriage assembly, to a first component, that performs the controlling and (2) receiving, from the first component, a second signal at a second component that causes the moving.

CONCLUSION

While embodiments of the present invention have been described above, it should be understood that they have been presented by way of example only, and not limitation. It will be understood by those skilled in the art that various changes in form and detail may be made therein without departing from the spirit and scope of the invention as defined in the appended claims. Specifically, the skilled artisan will appreciate that the present invention can also reside in other photolithography systems, which can be configured in a manner different from that of exemplary EUV photolithography system 1500. Thus, the breadth and scope of the present invention should not be limited by the above-described exemplary embodiments, but should be defined only in accordance with the following claims and their equivalents.

What is claimed is:

1. In a photolithography system, a method for controlling a first reticle-masking blade having at least a first masking edge and a second masking edge, the method comprising:
   (1) supporting the first reticle-masking blade with a first stage;
   (2) producing a first magnetic force to levitate the first stage, wherein the first magnetic force is produced through an application of substantially constant current to at least one coil group of a plurality of coil groups, and wherein each coil group within the plurality of coil groups is oriented orthogonally with respect to adjacent coil groups; and
   (3) moving the levitated first stage in a plane normal to a direction of levitation through an application of varying currents to at least one coil group of the plurality of coil groups, such that said first reticle-masking blade partially overlaps a second reticle-masking blade having at least a third masking edge parallel to said first masking edge of said first reticle-masking blade, and a fourth masking edge parallel to said second masking edge of said first reticle-masking blade,
   wherein said first through fourth respective masking edges of said first and second reticle-masking blades define an exposure aperture.

2. The method of claim 1, further comprising:
   producing a second force to move the levitated first stage.

3. The method of claim 2, wherein the second force comprises a second magnetic force.

4. The method of claim 1, wherein the first stage is levitated at a position with respect to a reference frame and at an orientation with respect to the reference frame and further comprising:
   (4) measuring at least one of the position and the orientation of the first stage; and
   (5) controlling at least one of the position and the orientation of the first stage.

5. A reticle-masking blade system, comprising:
   a first reticle-masking blade, said first reticle-masking blade having at least a first masking edge and a second masking edge;
   a first stage that supports said first reticle-masking blade;
   a reaction frame;
   an actuator including a plurality of coil groups that produces a first force to magnetically levitate said first stage through an application of substantially constant current to at least one coil group of the plurality of coil groups, wherein each coil group within the plurality of coil groups is oriented orthogonally with respect to adjacent coil groups, said actuator having a first component coupled to said first stage and a second component coupled to said reaction frame; and a second reticle-masking blade having at least a third masking edge parallel to said first masking edge of said first reticle-masking blade, and a fourth masking edge parallel to said second masking edge of said first reticle-masking blade;

wherein the levitated first stage is configured to move in a plane normal to a direction of levitation through an application of varying currents to at least one coil group of the plurality of coil groups, such that said first reticle-masking blade partially overlaps said second reticle-masking blade in a configuration where said first through fourth respective masking edges of said first and second reticle-masking blades define an exposure aperture.

6. The system of claim 5, wherein said first force is a repulsive force.

7. The system of claim 5, wherein said first force is an attractive force.

8. The system of claim 5, further comprising a motor coupled to said first stage, wherein said motor produces a second force to move said levitated first stage in said plane normal to said direction of levitation.

9. The system of claim 8, wherein said second force comprises a second magnetic force.

10. The reticle-masking blade system of claim 5, wherein said first reticle-masking blade has a substantially staircase-like profile, comprising:
a first additional masking edge parallel to said first masking edge and coupled to said second masking edge; and
a second additional masking edge parallel to said second masking edge and coupled to said first additional masking edge.

11. The reticle-masking blade system of claim 5, further comprising:
a reference frame; and
a sensor configured to measure an orientation of said first stage with respect to the reference frame.

12. The reticle-masking blade system of claim 11, further comprising a controller configured to control said orientation.

13. The reticle-masking blade system of claim 5, wherein said second reticle-masking blade is supported by a second stage.

14. The reticle-masking blade system of claim 13, wherein said second stage is magnetically levitated, and is configured to move in said plane normal to said direction of levitation.

15. The reticle-masking blade system of claim 14, wherein said actuator has a third component coupled to said second stage to magnetically levitate and move the second stage.

16. In a photolithography system, a method for controlling a first reticle-masking blade having at least a first masking edge and a second masking edge, the method comprising:
(a) supporting the first reticle-masking blade with a first stage;
(b) producing a first magnetic force to levitate the first stage, wherein the first magnetic force is produced through an application of substantially constant current to a plurality of coil groups, and wherein each coil group within the plurality of coil groups is oriented orthogonally with respect to adjacent coil groups; and
(c) moving the levitated first stage in a plane normal to a direction of levitation through an application of varying currents to the plurality of coil groups.

17. The method of claim 16, further comprising:
(d) using the first reticle-masking blade to partially overlap a second reticle-masking blade having at least a third masking edge parallel to the first masking edge of the first reticle-masking blade, and a fourth masking edge parallel to the second masking edge of the first reticle-masking blade,
wherein the first through fourth respective masking edges of the first and second reticle-masking blades define an exposure aperture.

18. A reticle-masking blade system, comprising:
a first reticle-masking blade, the first reticle-masking blade having at least a first masking edge and a second masking edge;
a first stage that supports the first reticle-masking blade;
a reaction frame; and
an actuator including a plurality of coil groups that produces a first force to magnetically levitate the first stage through an application of substantially constant current to the plurality of coil groups,
wherein each coil group within the plurality of coil groups is oriented orthogonally with respect to adjacent coil groups, the actuator having a first component coupled to the first stage and a second component coupled to the reaction frame,
wherein the levitated first stage is configured to move in a plane normal to a direction of levitation through an application of varying currents to the plurality of coil groups.

19. The reticle-masking blade system of claim 18, further comprising:
a second reticle-masking blade having at least a third masking edge parallel to the first masking edge of the first reticle-masking blade and a fourth masking edge parallel to the second masking edge of the first reticle-masking blade;
wherein the first reticle-masking blade partially overlaps the second reticle-masking blade in a configuration; and
wherein the first through fourth respective masking edges of the first and second reticle-masking blades define an exposure aperture.

* * * * *

UNITED STATES PATENT AND TRADEMARK OFFICE
CERTIFICATE OF CORRECTION

PATENT NO. : 7,372,548 B2  Page 1 of 1
APPLICATION NO. : 11/218620
DATED : May 13, 2008
INVENTOR(S) : Carter et al.

It is certified that error appears in the above-identified patent and that said Letters Patent is hereby corrected as shown below:

<u>Column 1</u>

Line 9, CROSS-REFERENCE TO RELATED APPLICATIONS section please replace "Jun. 6, 2003" with --Jun. 2, 2003--.

Line 16, CROSS-REFERENCE TO RELATED APPLICATIONS section please replace "Jun. 6, 2003" with --Jun. 2, 2003--.

Signed and Sealed this

Fifth Day of August, 2008

JON W. DUDAS
*Director of the United States Patent and Trademark Office*